US012805079B2

(12) United States Patent
Soer et al.

(10) Patent No.: US 12,805,079 B2
(45) Date of Patent: Nov. 17, 2026

(54) PRIMARY OPTICS ARRAY FOR A LIGHT-EMITTING ARRAY

(71) Applicant: LUMILEDS LLC, San Jose, CA (US)

(72) Inventors: Wouter Soer, Utrecht (NL); Franklin Chiang, San Jose, CA (US); Oleg Borisovich Shchekin, San Jose, CA (US)

(73) Assignee: LUMILEDS SINGAPORE PTE. LTD., Singapore (SG)

( * ) Notice: Subject to any disclaimer, the term of this patent is extended or adjusted under 35 U.S.C. 154(b) by 560 days.

(21) Appl. No.: 18/210,484

(22) Filed: Jun. 15, 2023

(65) Prior Publication Data

US 2023/0343908 A1 Oct. 26, 2023

Related U.S. Application Data

(63) Continuation of application No. PCT/US2021/010057, filed on Dec. 15, 2021, and a (Continued)

(51) Int. Cl.

| | |
|---|---|
| ***H10H 20/855*** | (2025.01) |
| ***G02B 1/00*** | (2006.01) |
| ***H10W 90/00*** | (2026.01) |

(52) U.S. Cl.

CPC ........... *H10H 20/855* (2025.01); *G02B 1/002* (2013.01); *H10W 90/00* (2026.01)

(58) Field of Classification Search

CPC ....... H10W 90/00; H10H 20/851; G09G 3/32; G02B 1/002

(Continued)

(56) References Cited

U.S. PATENT DOCUMENTS

| | | | |
|---|---|---|---|
| 2015/0085384 | A1 | 3/2015 | Choi et al. |
| 2016/0318437 | A1 | 11/2016 | Vilakathara |

(Continued)

FOREIGN PATENT DOCUMENTS

| | | | |
|---|---|---|---|
| CN | 111403430 | A | 7/2020 |
| EP | 3537214 | A1 | 9/2019 |

OTHER PUBLICATIONS

From the Korean Intellectual Property Office (KIPO) as the ISA, "Notification of Transmittal of the International Search Report and the Written Opinion of the International Searching Authority, or the Declaration", PCT/US2021/010056, Apr. 12, 2022, 10 pages.

(Continued)

*Primary Examiner* — Eliseo Ramos Feliciano
*Assistant Examiner* — Mikka Liu

(57) ABSTRACT

A light-emitting apparatus includes light-emitting and primary optics arrays. The light-emitting array includes multiple light-emitting pixel elements, each emitting at one of one or more output wavelengths. The primary optics array includes multiple metastructured primary optical elements, each receiving output light from a corresponding pixel element and redirecting that light to form a portion of array output light. Different primary optical elements receive pixel output light from different corresponding pixel elements. The primary optical elements differ from one another with respect to structural arrangement of their corresponding metastructures. Those different arrangements result in differing collimation, propagation directions, or angular radiation distributions of the corresponding portions of array output light emitted by different pixel elements of the light-emitting array.

20 Claims, 13 Drawing Sheets

Related U.S. Application Data continuation of application No. PCT/US2021/010056, filed on Dec. 15, 2021.

(60) Provisional application No. 63/125,622, filed on Dec. 15, 2020.

(58) Field of Classification Search
USPC .......................................................... 257/88–89
See application file for complete search history.

(56) References Cited

U.S. PATENT DOCUMENTS

| | | | | |
|---|---|---|---|---|
| 2018/0073700 | A1 | 3/2018 | Orisich et al. | |
| 2018/0219144 | A1 | 8/2018 | Perkins et al. | |
| 2019/0121004 | A1* | 4/2019 | Ahmed | G02B 5/021 |
| 2020/0135703 | A1* | 4/2020 | Ahmed | B82Y 20/00 |
| 2020/0200951 | A1 | 6/2020 | Ahmed et al. | |

OTHER PUBLICATIONS

From the Korean Intellectual Property Office (KIPO) as the ISA, “Notification of Transmittal of the International Search Report and the Written Opinion of the International Searching Authority, or the Declaration”, PCT/US2021/010057, Apr. 12, 2022, 11 pages.
The extended European search report dated Aug. 23, 2024 corresponding to EP 21907330.1 filed Jul. 14, 2023, 7 pages.

* cited by examiner

PRIMARY OPTICS ARRAY FOR A LIGHT-EMITTING ARRAY

This application is a continuation of international App. No. PCT/US2021/010056 entitled “Primary optics array for a light-emitting array” filed 15 Dec. 2021 in the names of Wouter Soer, Franklin Chiang, and Oleg Borisovich Shchekin, which claims priority of U.S. provisional App. No. 63/125,622 entitled “Directional lighting system with distributed primary optics” filed 15 Dec. 2020 in the names of inventors of Wouter Soer, Franklin Chiang, and Oleg Borisovich Shchekin. This application is a continuation of international App. No. PCT/US2021/010057 entitled “Primary optics array for a light-emitting array” filed 15 Dec. 2021 in the names of Wouter Soer, Franklin Chiang, and Oleg Borisovich Shchekin, which claims priority of U.S. provisional App. No. 63/125,622 entitled “Directional lighting system with distributed primary optics” filed 15 Dec. 2020 in the names of inventors of Wouter Soer, Franklin Chiang, and Oleg Borisovich Shchekin. Each of said applications is incorporated herein by reference in its entirety.

FIELD OF THE INVENTION

The invention relates generally to light emitting diodes and to phosphor-converted light emitting diodes.

BACKGROUND

Semiconductor light emitting diodes and laser diodes (collectively referred to herein as “LEDs”) are among the most efficient light sources currently available. The emission spectrum of an LED typically exhibits a single narrow peak at a wavelength determined by the structure of the device and by the composition of the semiconductor materials from which it is constructed. By suitable choice of device structure and material system, LEDs may be designed to operate at ultraviolet, visible, or infrared wavelengths.

LEDs may be combined with one or more wavelength converting materials (generally referred to herein as “phosphors”) that absorb light emitted by the LED and in response emit light of a longer wavelength. For such phosphor-converted LEDs (“pcLEDs”), the fraction of the light emitted by the LED that is absorbed by the phosphors depends on the amount of phosphor material in the optical path of the light emitted by the LED, for example on the concentration of phosphor material in a phosphor layer disposed on or around the LED and the thickness of the layer.

Phosphor-converted LEDs may be designed so that all of the light emitted by the LED is absorbed by one or more phosphors, in which case the emission from the pcLED is entirely from the phosphors. In such cases the phosphor may be selected, for example, to emit light in a narrow spectral region that is not efficiently generated directly by an LED.

Alternatively, pcLEDs may be designed so that only a portion of the light emitted by the LED is absorbed by the phosphors, in which case the emission from the pcLED is a mixture of light emitted by the LED and light emitted by the phosphors. By suitable choice of LED, phosphors, and phosphor composition, such a pcLED may be designed to emit, for example, white light having a desired color temperature and desired color-rendering properties.

Multiple LEDs or pcLEDs can be formed together on a single substrate to form an array. Such arrays can be employed to form active illuminated displays, such as those employed in, e.g., smartphones and smart watches, computer or video displays, augmented- or virtual-reality displays, or signage, or to form adaptive illumination sources, such as those employed in, e.g., automotive headlights, street lighting, camera flash sources, or flashlights (i.e., torches). An array having one or several or many individual devices per millimeter (e.g., device pitch or spacing of about a millimeter, a few hundred microns, or less than 100 microns, and separation between adjacent devices less than 100 microns or only a few tens of microns or less) typically is referred to as a miniLED array or a microLED array (alternatively, a μLED array). Such mini- or microLED arrays can in many instances also include phosphor converters as described above; such arrays can be referred to as pc-miniLED or pc-microLED arrays.

SUMMARY

An inventive light-emitting apparatus comprises a light-emitting array and a primary optics array. The light-emitting array includes multiple light-emitting pixel elements; each pixel element emits corresponding pixel output light at a corresponding one of one or more output wavelengths. The primary optics array includes multiple metastructured primary optical elements. Each primary optical element receives pixel output light from at least one corresponding pixel element, and redirects at least a portion of that received pixel output light to form a corresponding portion of array output light. Each primary optical element receives light from at least one corresponding pixel element different from at least one other pixel element corresponding to another primary optical element. Each primary optical element differs from at least one other primary optical element of the primary optics array with respect to structural arrangement of corresponding metastructures thereof. Those different arrangements result in differing collimation, propagation directions, or angular radiation distributions of the corresponding portions of array output light emitted by different pixel elements of the light-emitting array.

Objects and advantages pertaining to LEDs, pcLEDs, miniLED arrays, pc-miniLED arrays, microLED arrays, and pc-microLED arrays may become apparent upon referring to the examples illustrated in the drawings and disclosed in the following written description or appended claims.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

The examples depicted are shown only schematically; all features may not be shown in full detail or in proper proportion; for clarity certain features or structures may be exaggerated or diminished relative to others or omitted entirely; the drawings should not be regarded as being to scale unless explicitly indicated as being to scale. For example, individual LEDs may be exaggerated in their vertical dimensions or layer thicknesses relative to their lateral extent or relative to substrate or phosphor thicknesses. The examples shown should not be construed as limiting the scope of the present disclosure or appended claims.

DETAILED DESCRIPTION

The following detailed description should be read with reference to the drawings, in which identical reference numbers refer to like elements throughout the different figures. The drawings, which are not necessarily to scale, depict selective examples and are not intended to limit the scope of the inventive subject matter. The detailed description illustrates by way of example, not by way of limitation, the principles of the inventive subject matter. For purposes of simplicity and clarity, detailed descriptions of well-known devices, circuits, and methods may be omitted so as not to obscure the description of the inventive subject matter with unnecessary detail.

Figure 1:
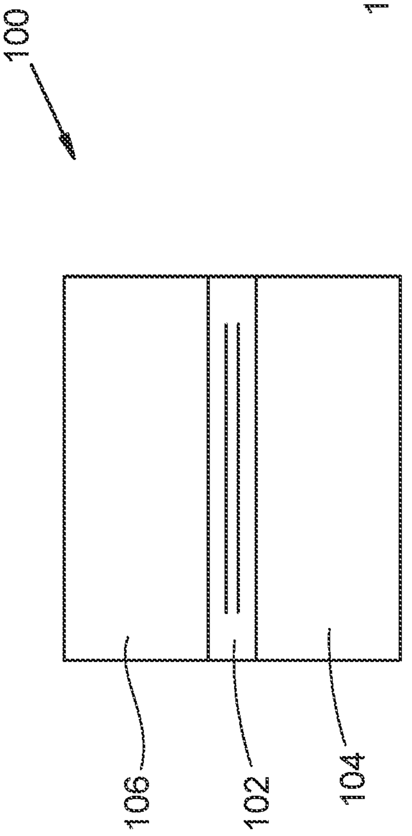
FIG. 1 shows a schematic cross-sectional view of an example pcLED.

FIG. 1 shows an example of an individual pcLED 100 comprising a semiconductor diode structure 102 disposed on a substrate 104, together considered herein an “LED” or “semiconductor LED”, and a wavelength converting structure (e.g., phosphor layer) 106 disposed on the semiconductor LED. Semiconductor diode structure 102 typically comprises an active region disposed between n-type and p-type layers. Application of a suitable forward bias across the diode structure 102 results in emission of light from the active region. The wavelength of the emitted light is determined by the composition and structure of the active region.

The LED may be, for example, a III-Nitride LED that emits blue, violet, or ultraviolet light. LEDs formed from any other suitable material system and that emit any other suitable wavelength of light may also be used. Other suitable material systems may include, for example, III-Phosphide materials, III-Arsenide materials, other binary, ternary, or quaternary alloys of gallium, aluminum, indium, nitrogen, phosphorus, or arsenic, or II-VI materials.

Any suitable phosphor materials may be used for or incorporated into the wavelength converting structure 106, depending on the desired optical output from the pcLED.

Figure 2B:
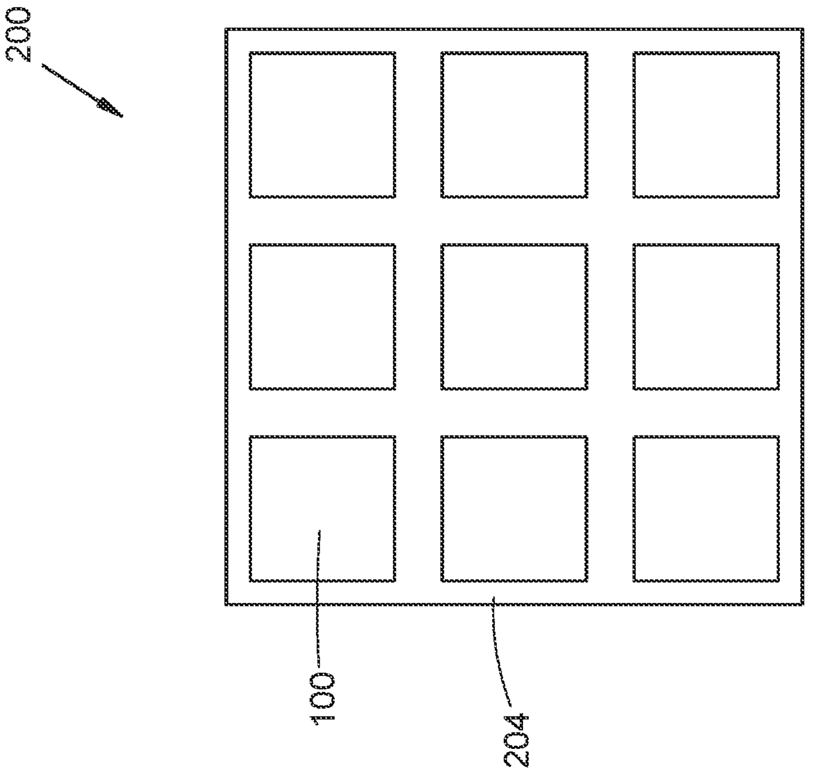
FIGS. 2A and 2B show, respectively, cross-sectional and top schematic views of an example array of pcLEDs.
Figure 2A:
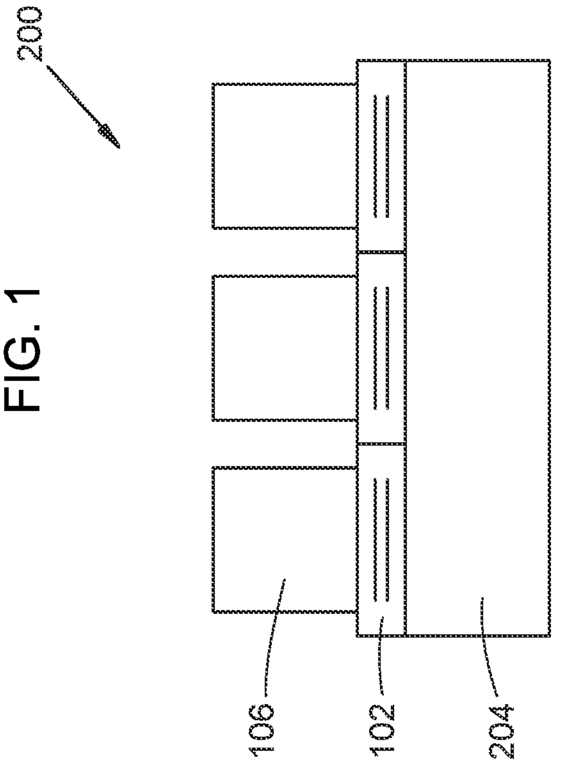

FIGS. 2A-2B show, respectively, cross-sectional and top views of an array 200 of pcLEDs 100, each including a phosphor pixel 106, disposed on a substrate 204. Such an array can include any suitable number of pcLEDs arranged in any suitable manner. In the illustrated example the array is depicted as formed monolithically on a shared substrate, but alternatively an array of pcLEDs can be formed from separate individual pcLEDs (e.g., singulated devices that are assembled onto an array substrate). Individual phosphor pixels 106 are shown in the illustrated example, but alternatively a contiguous layer of phosphor material can be disposed across multiple LEDs 102. In some instances the array 200 can include light barriers (e.g., reflective, scattering, and/or absorbing) between adjacent LEDs 102, phosphor pixels 106, or both. Substrate 204 may optionally include electrical traces or interconnects, or CMOS or other circuitry for driving the LED, and may be formed from any suitable materials.

Figure 3A:
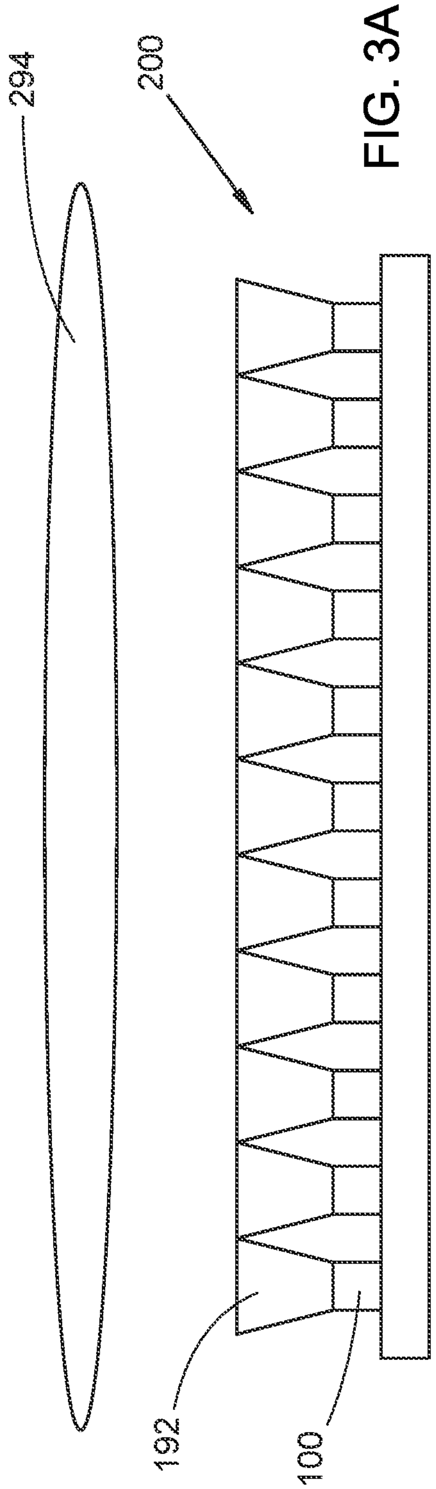
FIG. 3A shows a schematic cross-sectional view of an example array of pcLEDs arranged with respect to waveguides and a projection lens.
Figure 3B:
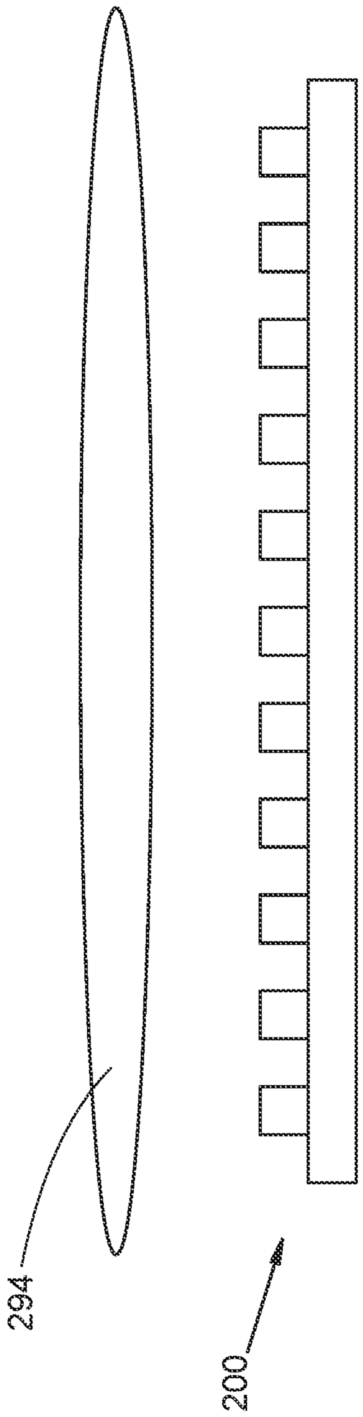
FIG. 3B shows an arrangement similar to that of FIG. 3A, but without the waveguides.

Individual pcLEDs 100 may optionally incorporate or be arranged in combination with a lens or other optical element located adjacent to or disposed on the phosphor layer. Such an optical element, not shown in the figures, may be referred to as a “primary optical element”. In addition, as shown in FIGS. 3A and 3B, a pcLED array 200 (for example, mounted on an electronics board) may be arranged in combination with secondary optical elements such as waveguides, lenses, or both for use in an intended application. In FIG. 3A, light emitted by each pcLED 100 of the array 200 is collected by a corresponding waveguide 192 and directed to a projection lens 294. Projection lens 294 may be a Fresnel lens, for example. This arrangement may be suitable for use, for example, in automobile headlights or other adaptive illumination sources. Other primary or secondary optical elements of any suitable type or arrangement can be included for each pixel, as needed or desired. In FIG. 3B, light emitted by pcLEDs of the array 200 is collected directly by projection lens 294 without use of intervening waveguides. This arrangement may particularly be suitable when pcLEDs can be spaced sufficiently close to each other, and may also be used in automobile headlights as well as in camera flash applications or other illumination sources. A miniLED or microLED display application may use similar optical arrangements to those depicted in FIGS. 3A and 3B, for example. Generally, any suitable arrangement of optical elements (primary, secondary, or both) can be used in combination with the pcLEDs described herein, depending on the desired application.

Figure 4A:
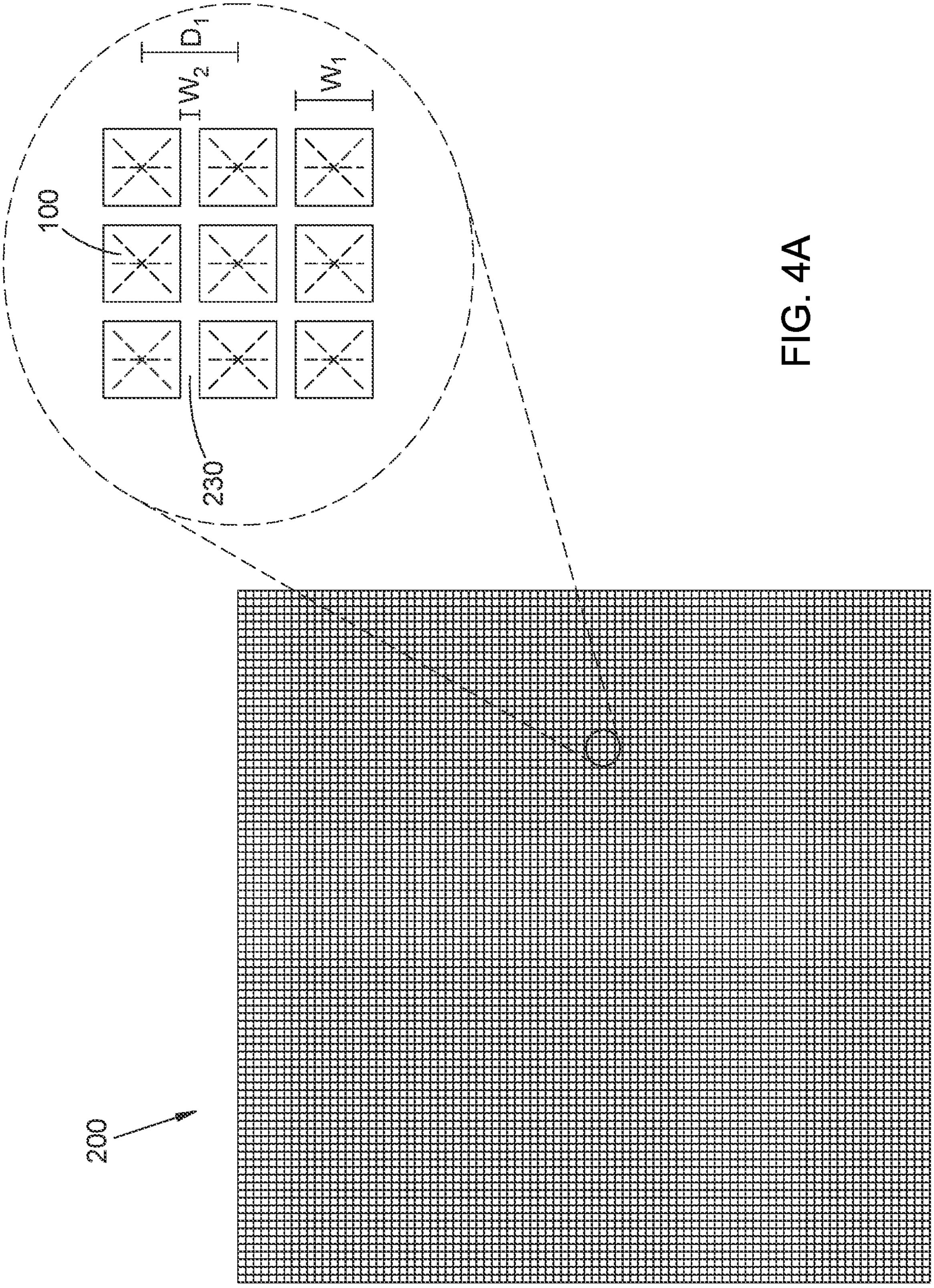
FIG. 4A shows a top schematic view of an example miniLED or microLED array and an enlarged section of 3×3 LEDs of the array.

Although FIGS. 2A and 2B show a 3×3 array of nine pcLEDs, such arrays may include for example on the order of $10^1$, $10^2$, $10^3$, $10^4$, or more LEDs, e.g., as illustrated schematically in FIG. 4A. Individual LEDs 100 (i.e., pixels) may have widths $w_1$ (e.g., side lengths) in the plane of the array 200, for example, less than or equal to 1 millimeter (mm), less than or equal to 500 microns, less than or equal to 100 microns, or less than or equal to 50 microns. LEDs 100 in the array 200 may be spaced apart from each other by streets, lanes, or trenches 230 having a width $w_2$ in the plane of the array 200 of, for example, hundreds of microns, less than or equal to 100 microns, less than or equal to 50 microns, less than or equal to 20 microns, less than or equal to 10 microns, or less than or equal to 5 microns. The pixel pitch or spacing Di is the sum of $w_1$ and $w_2$. Although the illustrated examples show rectangular pixels arranged in a symmetric matrix, the pixels and the array may have any suitable shape or arrangement, whether symmetric or asymmetric. Multiple separate arrays of LEDs can be combined in any suitable arrangement in any applicable format to form a larger combined array or display.

LEDs having dimensions $w_1$ in the plane of the array (e.g., side lengths) of less than or equal to about 0.10 millimeters microns are typically referred to as microLEDs, and an array of such microLEDs may be referred to as a microLED array. LEDs having dimensions $w_1$ in the plane of the array (e.g., side lengths) of between about 0.10 millimeters and about 1.0 millimeters are typically referred to as miniLEDs, and an array of such miniLEDs may be referred to as a miniLED array.

Figure 4B:
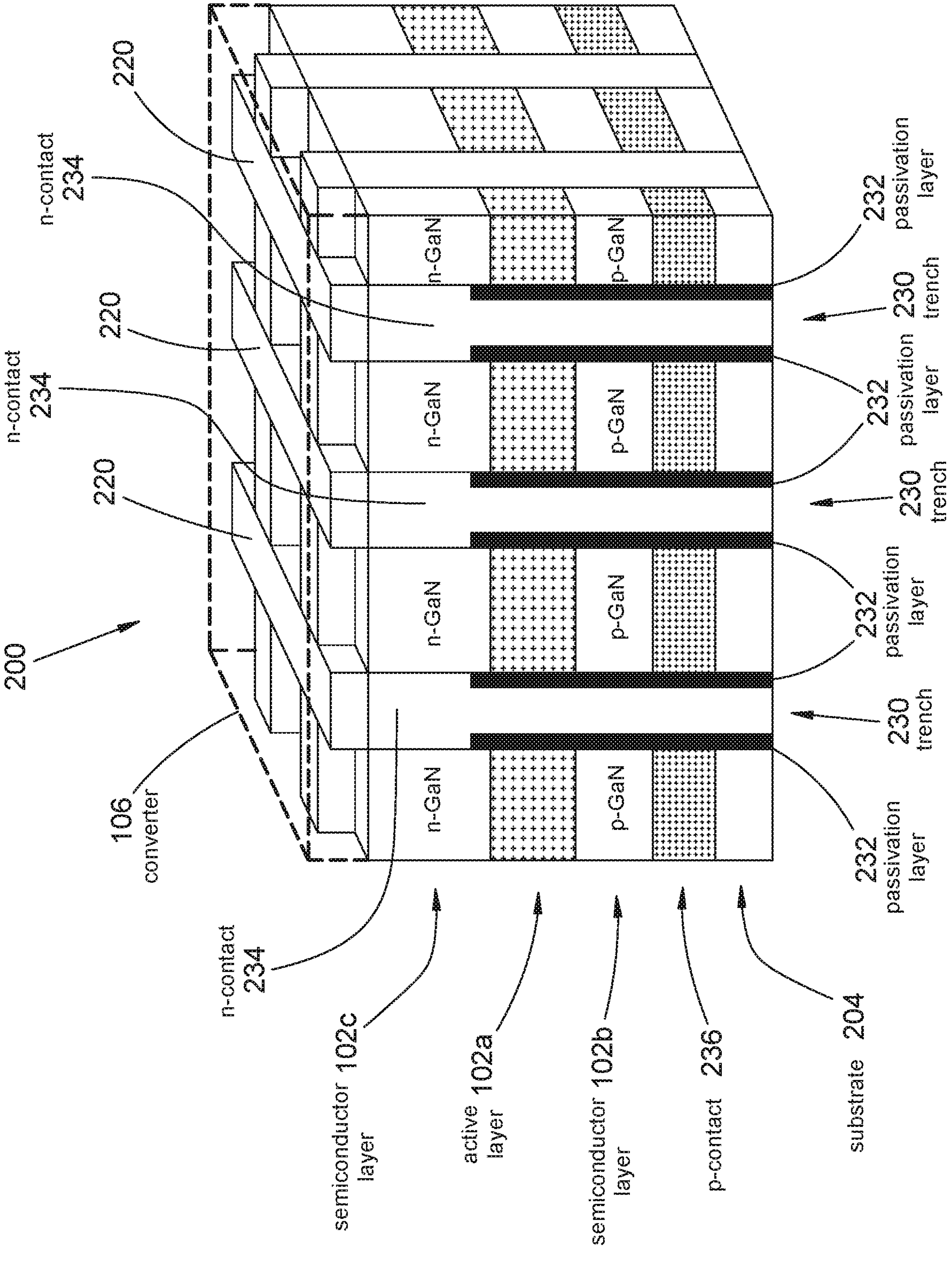
FIG. 4B shows a perspective view of several LEDs of an example pc-miniLED or pc-microLED array monolithically formed on a substrate.

An array of LEDs, miniLEDs, or microLEDs, or portions of such an array, may be formed as a segmented monolithic structure in which individual LED pixels are electrically isolated from each other by trenches and or insulating material. FIG. 4B shows a perspective view of an example of such a segmented monolithic LED array 200. Pixels in this array (i.e., individual semiconductor LED devices 102) are separated by trenches 230 which are filled to form n-contacts 234. The monolithic structure is grown or disposed on the substrate 204. Each pixel includes a p-contact 236, a p-GaN semiconductor layer 102*b*, an active region 102*a*, and an n-GaN semiconductor layer 102*c*; the layers 102*a*/102*b*/102*c* collectively form the semiconductor LED 102. A wavelength converter material 106 may be deposited on the semiconductor layer 102*c* (or other applicable intervening layer). Passivation layers 232 may be formed within the trenches 230 to separate at least a portion of the n-contacts 234 from one or more layers of the semiconductor. The n-contacts 234, other material within the trenches 230, or material different from material within the trenches 230 may extend into the converter material 106 to form complete or partial optical isolation barriers 220 between the pixels.

Figure 4C:
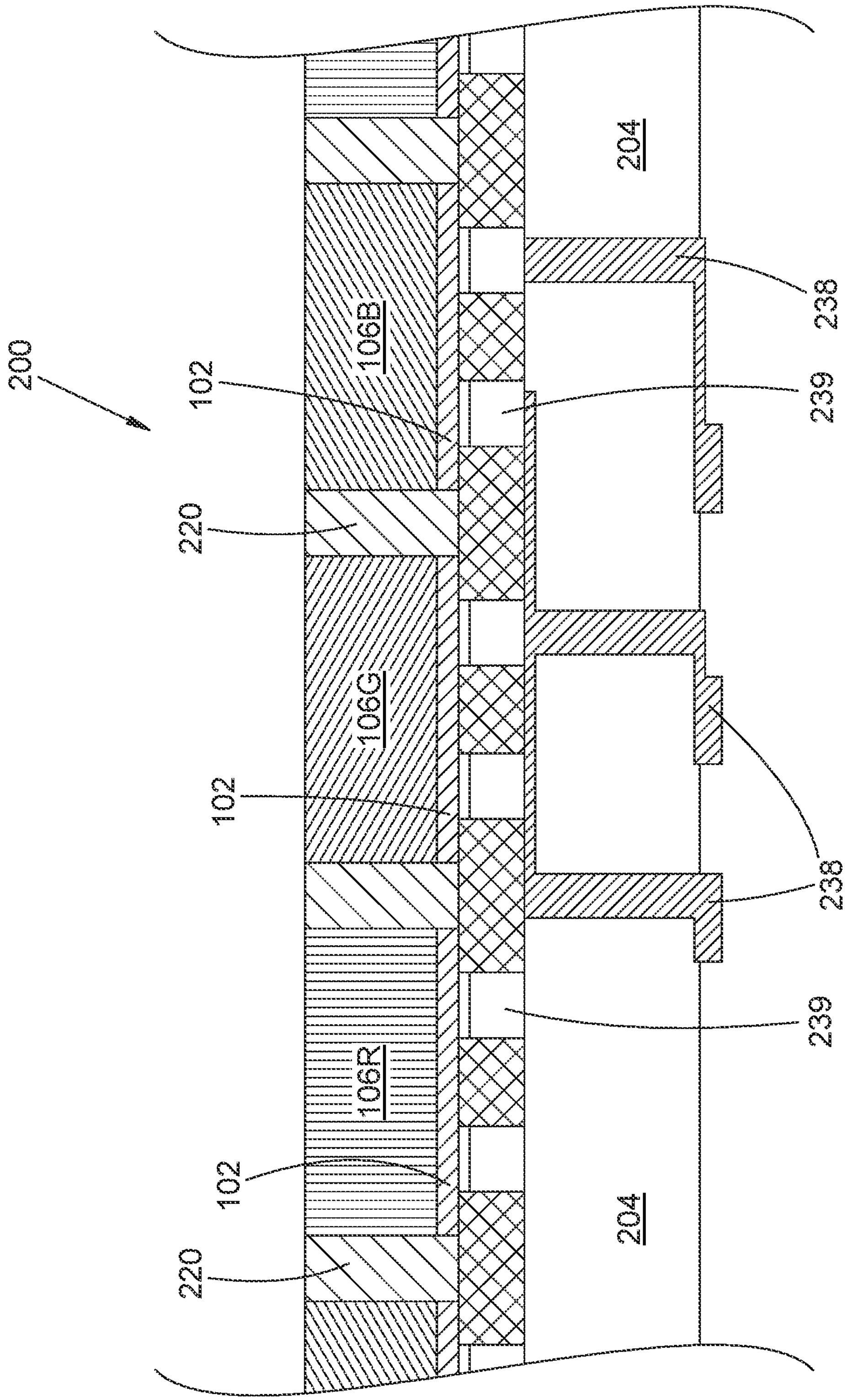
FIG. 4C is a side cross-sectional schematic diagram of an example of a close-packed array of multi-colored phosphor-converted LEDS on a monolithic die and substrate.

FIG. 4C is a schematic cross-sectional view of a close packed array 200 of multi-colored, phosphor converted LEDs 100 on a monolithic die and substrate 204. The side view shows GaN LEDs 102 attached to the substrate 204 through metal interconnects 239 (e.g., gold-gold interconnects or solder attached to copper micropillars) and metal interconnects 238. Phosphor pixels 106 are positioned on or over corresponding GaN LED pixels 102. The semiconductor LED pixels 102 or phosphor pixels 106 (often both) can be coated on their sides with a reflective mirror or diffusive scattering layer to form an optical isolation barrier 220. In this example each phosphor pixel 106 is one of three different colors, e.g., red phosphor pixels 106R, green phosphor pixels 106G, and blue phosphor pixels 106B (still referred to generally or collectively as phosphor pixels 106). Such an arrangement can enable use of the LED array 200 as a color display.

The individual LEDs (pixels) in an LED array may be individually addressable, may be addressable as part of a group or subset of the pixels in the array, or may not be addressable. Thus, light emitting pixel arrays are useful for any application requiring or benefiting from fine-grained intensity, spatial, and temporal control of light distribution. These applications may include, but are not limited to, precise special patterning of emitted light from pixel blocks or individual pixels, in some instances including the formation of images as a display device. Depending on the application, emitted light may be spectrally distinct, adaptive over time, and/or environmentally responsive. The light emitting pixel arrays may provide preprogrammed light distribution in various intensity, spatial, or temporal patterns. The emitted light may be based at least in part on received sensor data and may be used for optical wireless communications. Associated electronics and optics may be distinct at a pixel, pixel block, or device level.

Figure 5A:
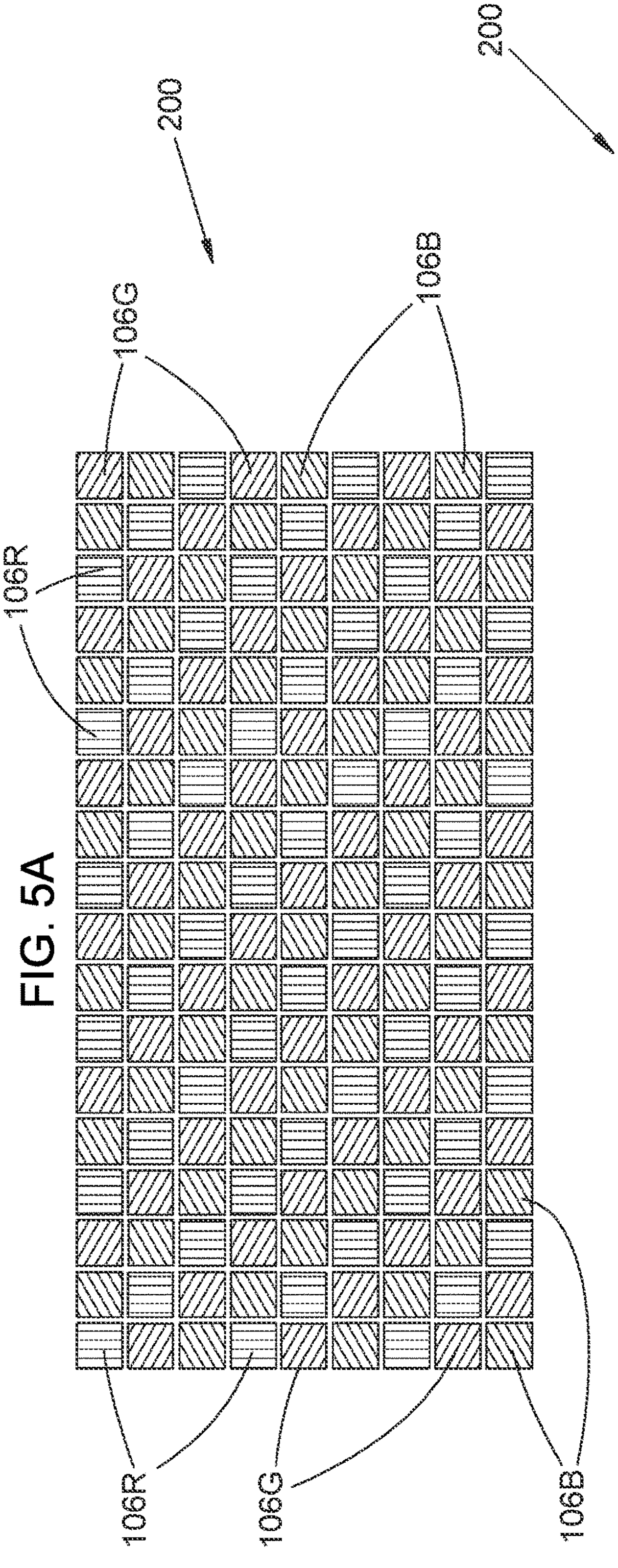
FIG. 5A is a schematic top view of a portion of an example LED display in which each display pixel is a red, green, or blue phosphor-converted LED pixel.
Figure 5B:
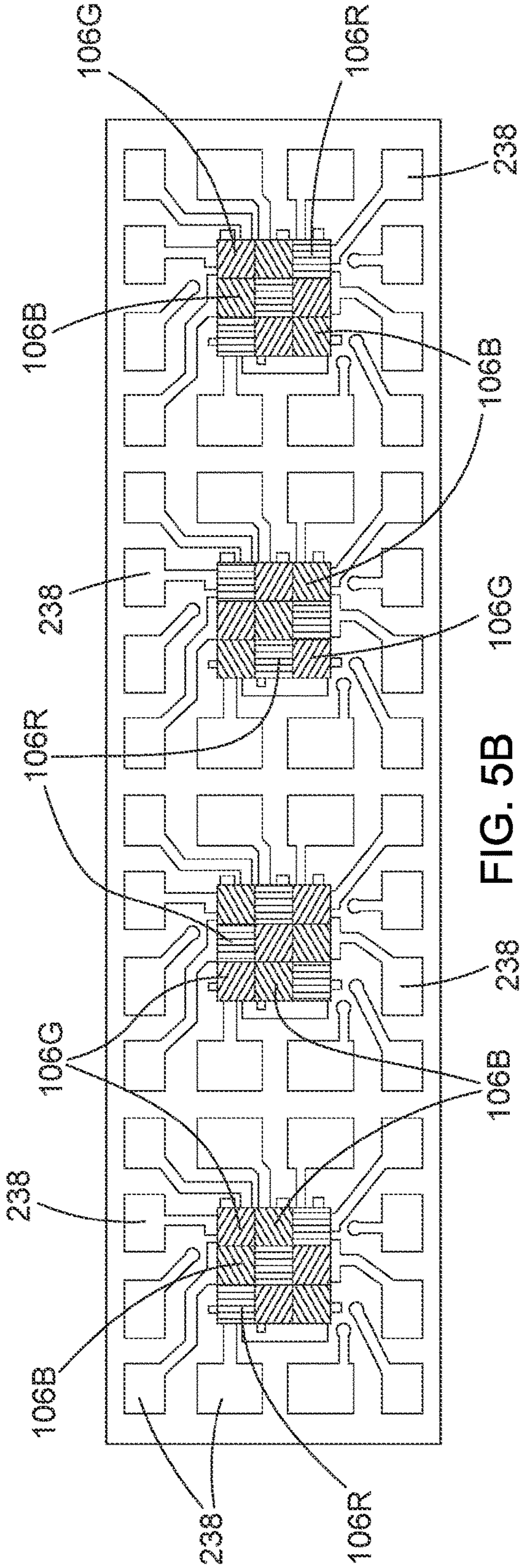
FIG. 5B is a schematic top view of a portion of an example LED display in which each display pixel includes multiple phosphor-converted LED pixels (red, green, and blue) integrated onto a single die that is bonded to a control circuit backplane.

FIGS. 5A and 5B are examples of LED arrays 200 employed in display applications, wherein an LED display includes a multitude of display pixels. In some examples (e.g., as in FIG. 5A), each display pixel comprises a single semiconductor LED pixel 102 and a corresponding phosphor pixel 106R, 106G, or 106B of a single color (red, green, or blue). Each display pixel only provides one of the three colors. In some examples (e.g., as in FIG. 5B), each display pixel includes multiple semiconductor LED pixels 102 and multiple corresponding phosphor pixels 106 of multiple colors. In the example shown each display pixel includes a 3×3 array of semiconductor pixels 102; three of those LED pixels have red phosphor pixels 106R, three have green phosphor pixels 106G, and three have blue phosphor pixels 106B. Each display pixel can therefore produce any desired color combination. In the example shown the spatial arrangement of the different colored phosphor pixels 106 differs among the display pixels; in some examples (not shown) each display pixel can have the same arrangement of the different colored phosphor pixels 106.

Figure 6B:
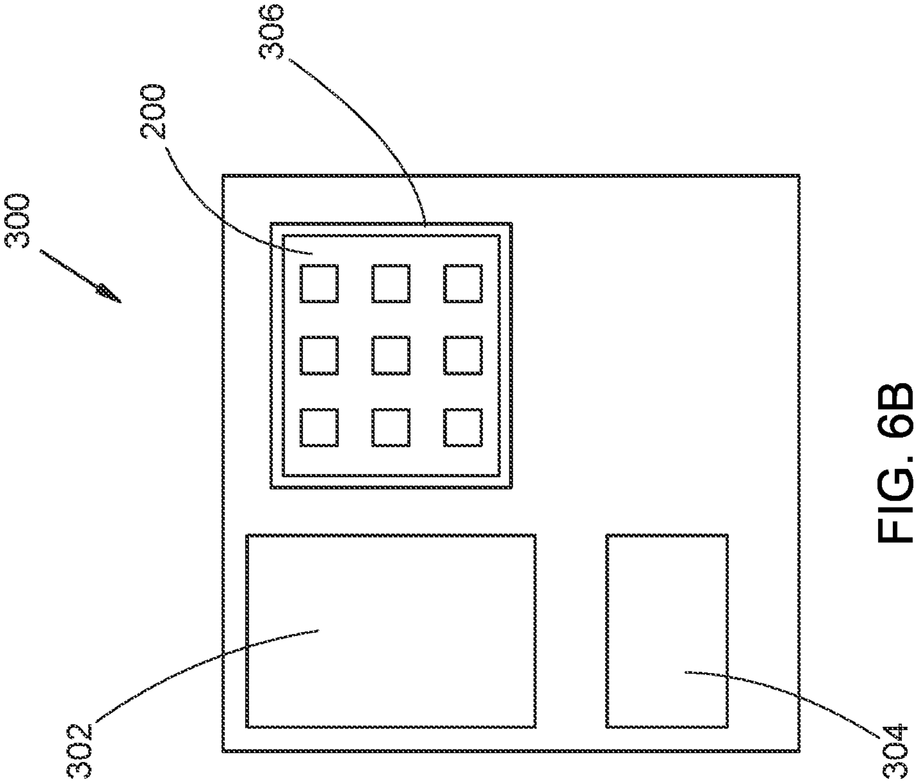
FIG. 6A shows a schematic top view an example electronics board on which an array of pcLEDs may be mounted, and FIG. 6B similarly shows an example array of pcLEDs mounted on the electronic board of FIG. 6A.
Figure 6A:
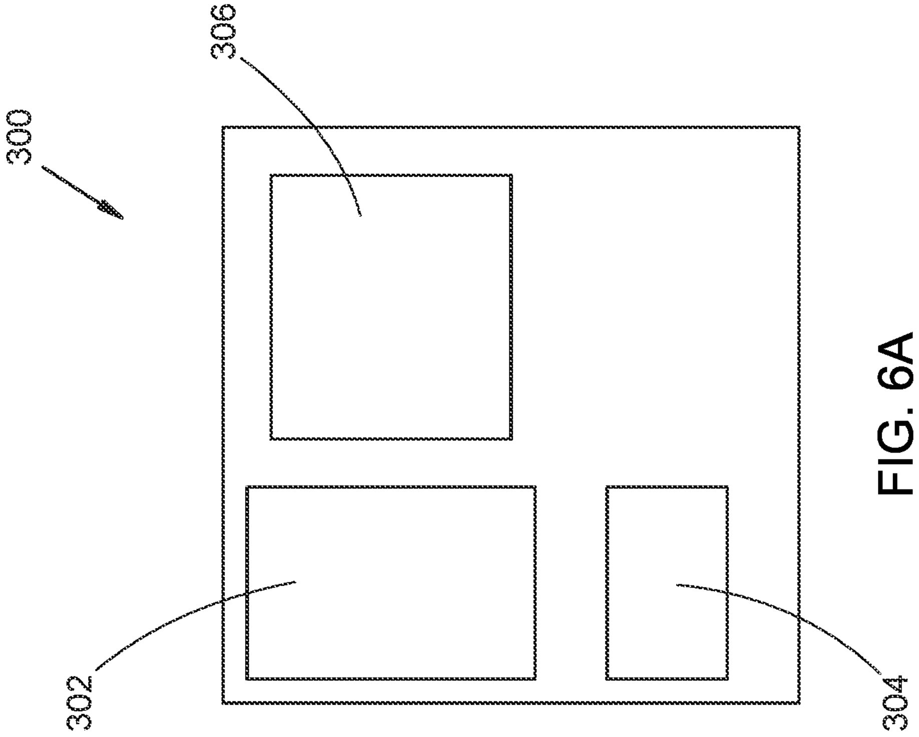
Figure 7A:
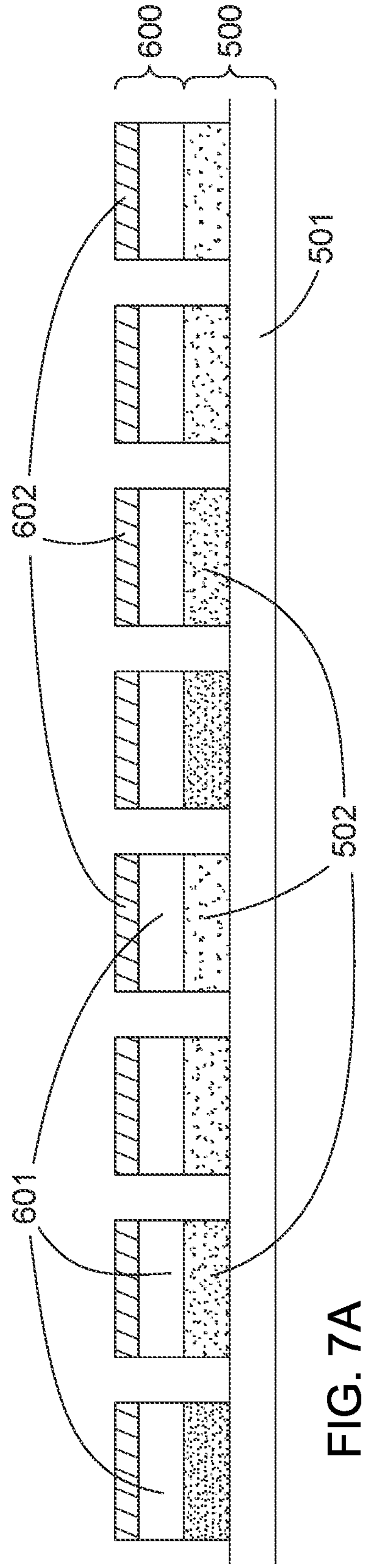
FIGS. 7A-7C are schematic representations of light-emitting arrays and corresponding arrays of metastructured primary optical elements. Different fill density in the drawings indicates light-emitting elements producing different wavelengths; different angled cross-hatching indicates primary optical elements producing different output collimation, direction, or angular distribution.
Figure 7B:
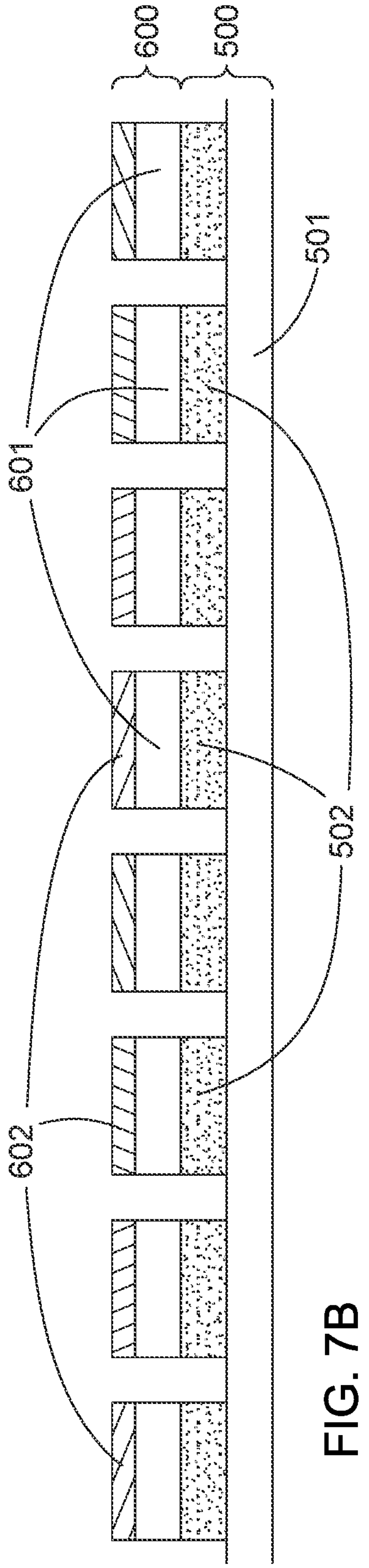
Figure 7C:
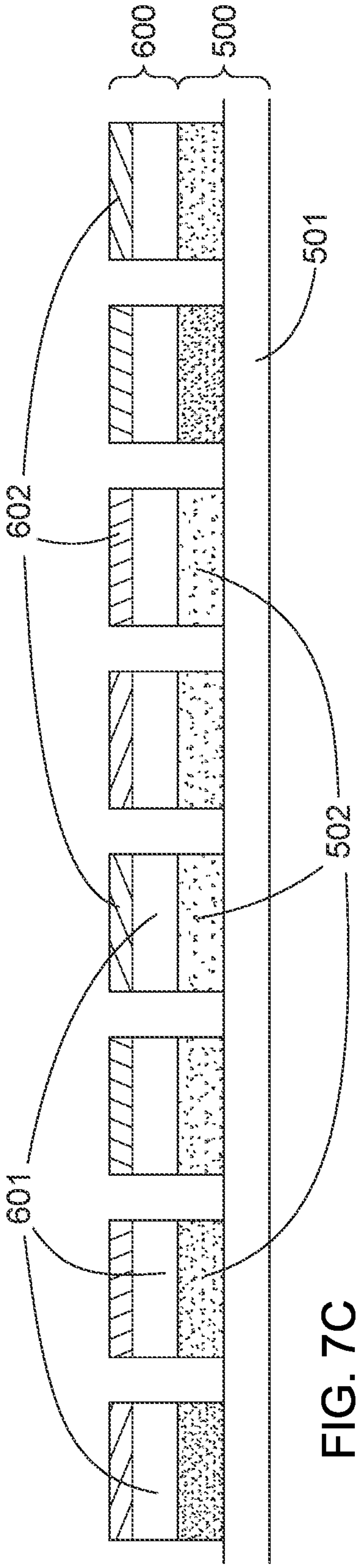
Figure 8:
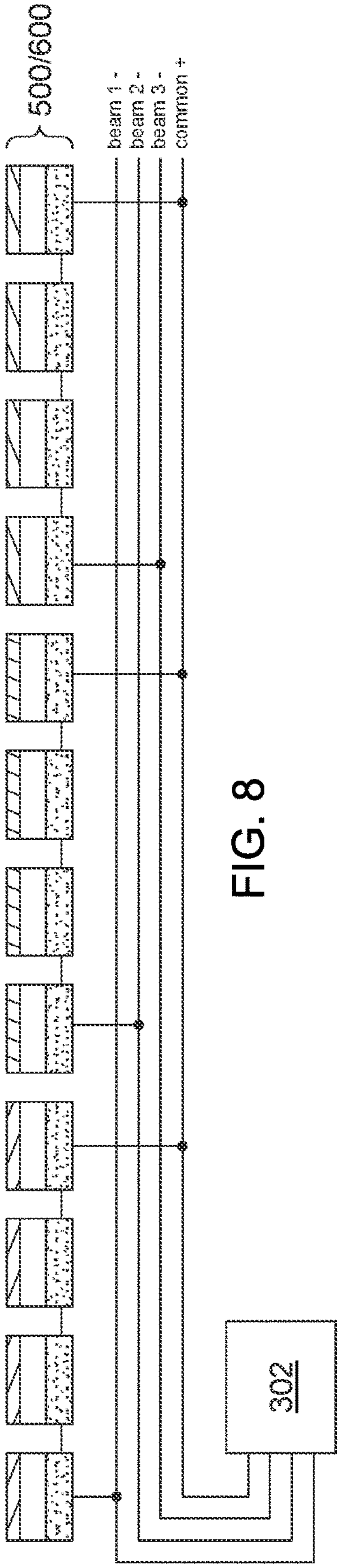
FIGS. 8 through 10 are schematic representations of light-emitting arrays, corresponding arrays of metastructured primary optical elements, and corresponding drive circuits connected to subsets of pixel elements.
Figure 9:
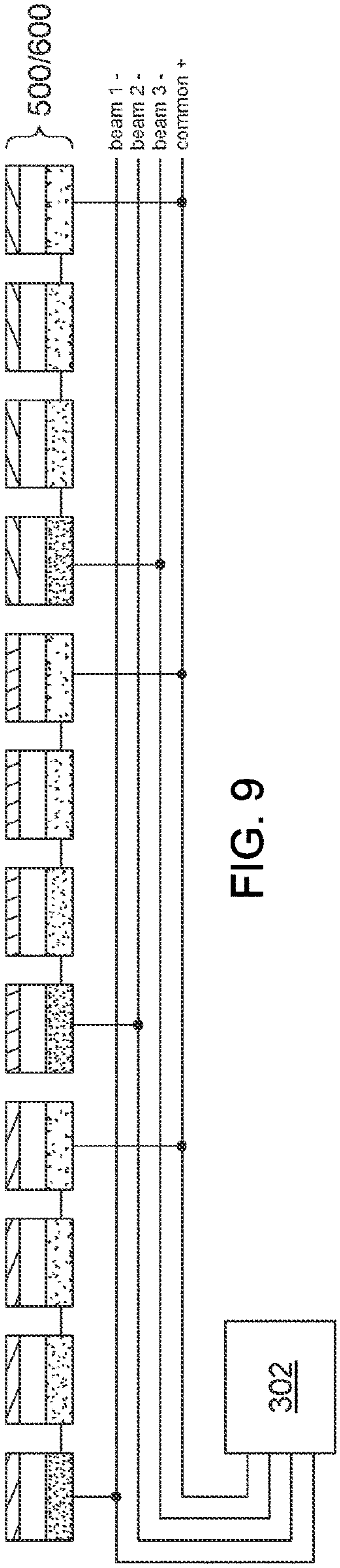
Figure 10:
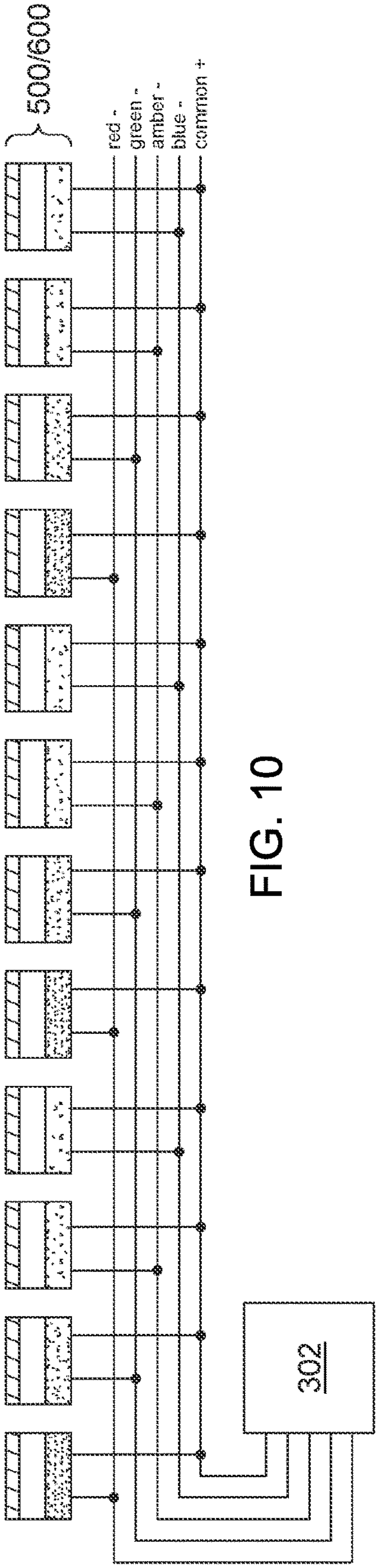

As shown in FIGS. 6A and 6B, a pcLED array 200 may be mounted on an electronics board 300 comprising a power and control module 302, a sensor module 304, and an LED attach region 306. Power and control module 302 may receive power and control signals from external sources and signals from sensor module 304, based on which power and control module 302 controls operation of the LEDs. Sensor module 304 may receive signals from any suitable sensors, for example from temperature or light sensors. Alternatively, pcLED array 200 may be mounted on a separate board (not shown) from the power and control module and the sensor module.

For purposes of the present disclosure and appended claims, any arrangement of a layer, surface, substrate, diode structure, or other structure "on," "over," or "against" another such structure shall encompass arrangements with direct contact between the two structures as well as arrangements including some intervening structure between them. Conversely, any arrangement of a layer, surface, substrate, diode structure, or other structure "directly on," "directly over," or "directly against" another such structure shall encompass only arrangements with direct contact between the two structures. For purposes of the present disclosure and appended claims, a layer, structure, or material described as "transparent" and "substantially transparent" shall exhibit, at the output wavelengths, a level of optical transmission that is sufficiently high, or a level of optical loss (due to absorption, scattering, or other loss mechanism) that is sufficiently low, that the light-emitting apparatus can function within operationally acceptable parameters (e.g., output power or luminance, conversion or extraction efficiency, or other figures-of-merit including those described below).

In lighting or illumination applications (e.g., down lighting or task lighting, street lighting, camera flash, automotive headlights, and so forth), it is often desirable for the light source to be adaptive, i.e., to enable dynamic alteration of a far-field illumination pattern. One approach is to arrange secondary optics (e.g., element 294 in FIGS. 3A and 3B) to image an array of LEDs in the far-field. Activating different subsets of pixels of the LED array results in different far-field illumination pattern. That approach is disclosed in, e.g., U.S. non-provisional application Ser. No. 17/182,005 filed 22 Feb. 2021 (now U.S. Pat. No. 11,204,153); said application is incorporated herein by reference in its entirety.

While that previous approach can provide satisfactory illumination in some instances, in some other instances problems can arise. For example, in white-light illumination, the pixels of the LED array produce multiple output wavelengths among them to yield white light. A secondary optical element often has properties (e.g., effective focal length, beam-steering angle, or beam angular radiative distribution) that vary with wavelength. Using a secondary optical element for multiple different output wavelengths in some instances can lead to degraded color uniformity in the far-field illumination pattern, such as perceptible color separation or colored shadows or artifacts.

In the examples of inventive light-emitting apparatus disclosed herein, those potential problems are mitigated or avoided by employing suitably designed and arranged primary optics (i.e., optical elements deployed on a per-pixel basis across a light-emitting array) to achieve a desired far-field illumination pattern. Each primary optical element can be designed and arranged to exhibit certain desired optical properties (e.g., effective focal length, beam steering angle, or angular beam radiative distribution) for the specific wavelength of each pixel element. Accordingly, primary optical elements providing the same optical properties for corresponding pixel elements emitting different corresponding wavelengths typically differ from one another structurally even while providing the same imaging, beam steering, or beam angular radiative distribution for those corresponding pixel elements. Such individually designed and arranged primary optics also can be employed in single-wavelength light-emitting arrays for achieving a desired far-field illumination pattern.

Various examples of inventive light-emitting apparatus are illustrated schematically in FIGS. 7*a*-7C and 8-10. An inventive light-emitting apparatus includes a light-emitting array 500 and a primary optics array 600.

Figure 11:
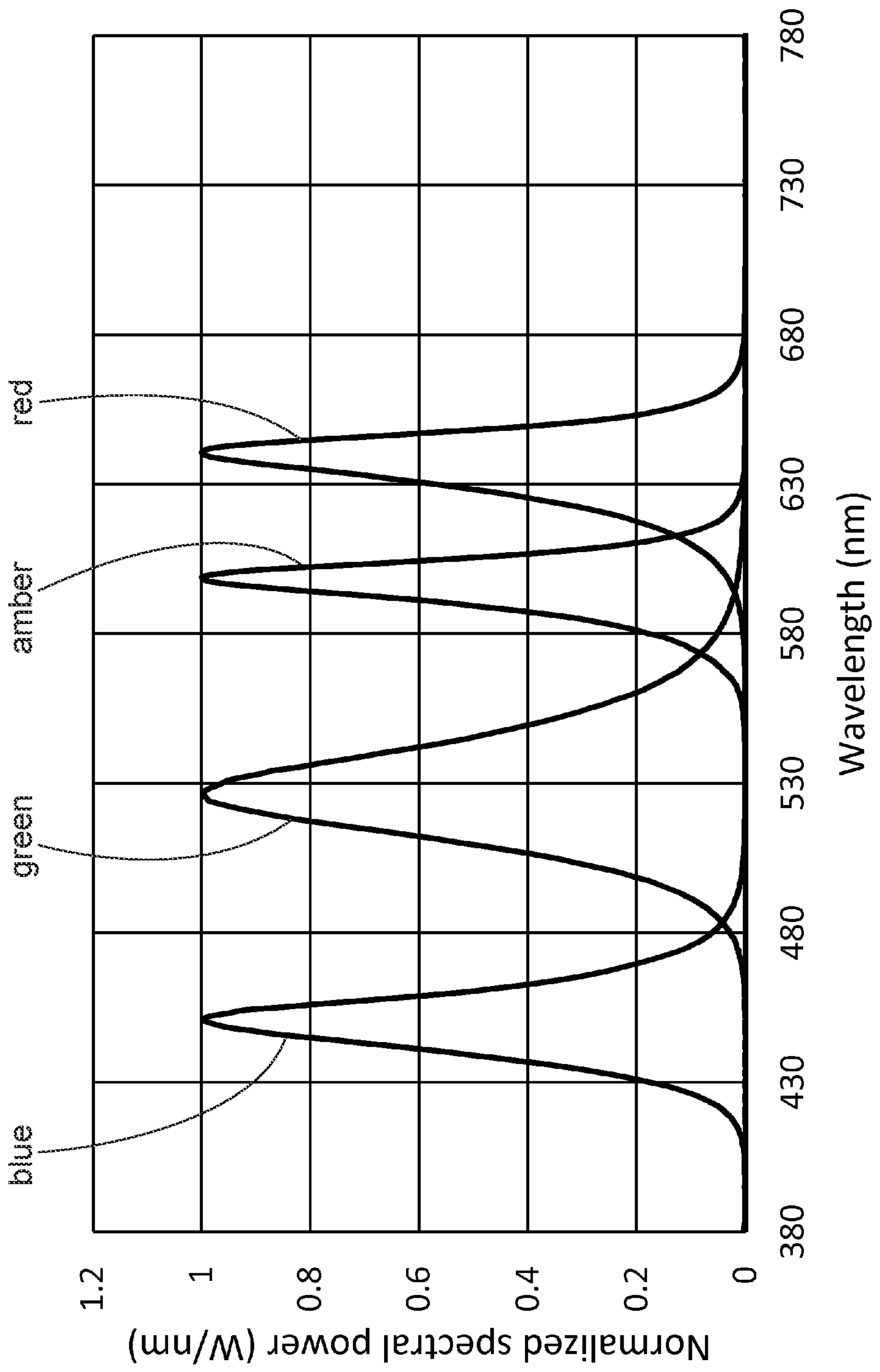
FIG. 11 includes spectra of four different output wavelengths.
Figure 12:
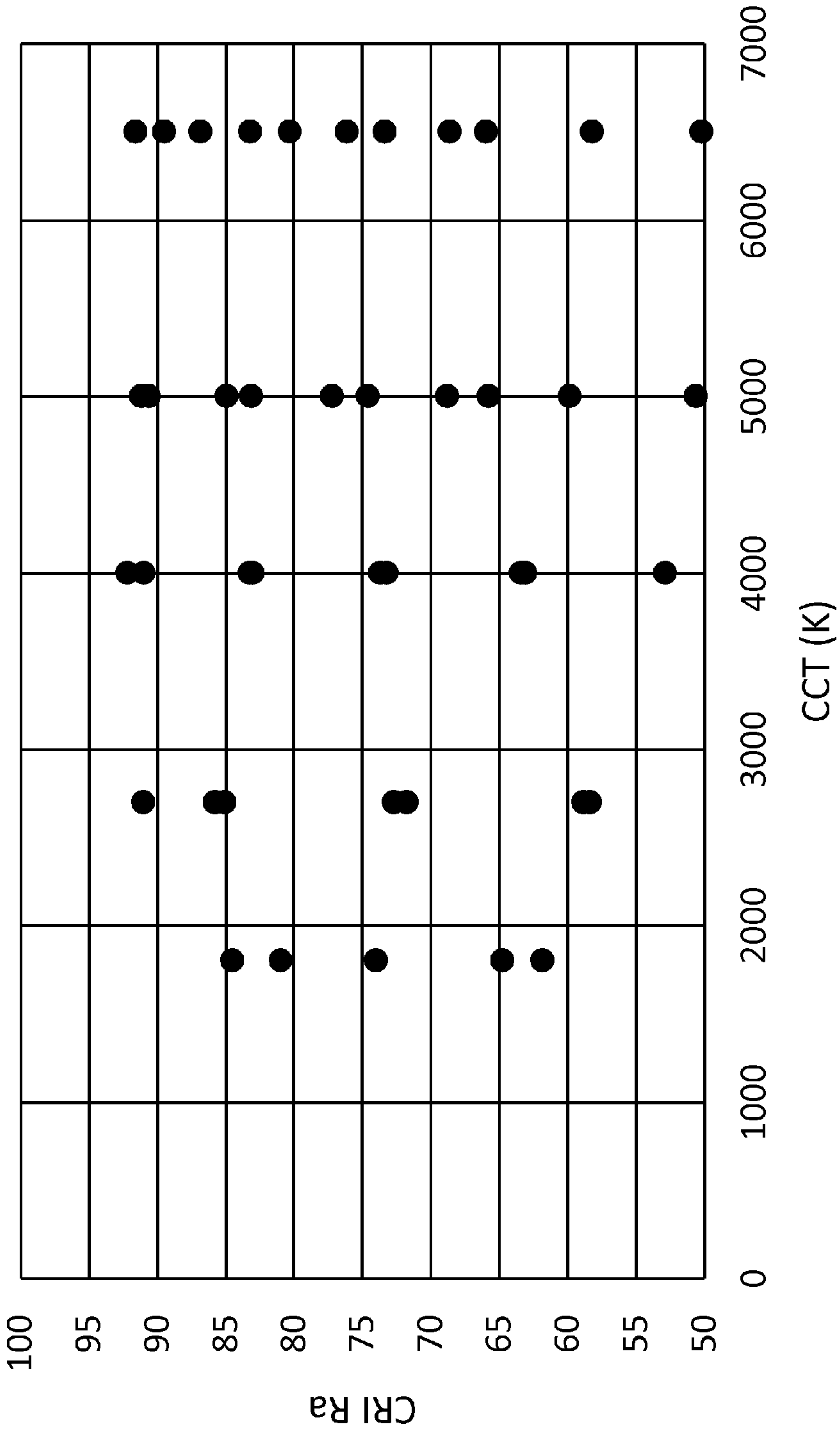
FIG. 12 shows different CRI $R_a$ values obtained using different combinations of the output wavelengths of FIG. 11 targeted to different color temperatures.

The light-emitting array 500 comprises multiple light-emitting pixel elements 502, each emitting corresponding pixel output light at a corresponding output wavelength. Each output wavelength typically is a relatively small range of wavelengths (e.g., spectral full width at half maximum of less than 10 nm, less than 20 nm, or less than 40 nm) that includes a corresponding nominal output wavelength; that minimal output wavelength is referred to herein as the output wavelength. In some examples all of the pixel elements 502 emit the same, single common output wavelength; in other examples each pixel element emits one of multiple different output wavelengths (in some examples 3, 4, 5, or more different output wavelengths). In some examples the one or multiple output wavelengths can be greater than 0.20 μm, greater than 0.4 μm, greater than 0.8 μm, less than 10. μm, less than 2.5 μm, or less than 1.0 μm. In some examples the multiple output wavelengths can include red, green, and blue wavelengths (suitable in some instances for producing white light of a desired color temperature, e.g., between 1500 K and 6500 K); in some examples the multiple output wavelengths can include red, green, amber, and blue wavelengths (e.g., as in FIG. 11) that are suitable in some instances for providing a sufficiently high Color Rendering Index (e.g., CIE $R_a$ between 50 and 95; see FIG. 12); in some examples the multiple output wavelengths can include a first output wavelength between 455 nm and 465 nm, a second output wavelength between 533 nm and 543 nm, a third wavelength between 580. nm and 590. nm, and a fourth wavelength between 608 nm and 618 nm.

In some examples each pixel element 502 can be a semiconductor light-emitting diode (LED). In some examples each LED can include one or more doped or undoped III-V, II-VI, or Group IV semiconductor materials or alloys or mixtures thereof; in some examples each LED can include one or more p-n junctions, one or more quantum wells, one or more multi-quantum wells, or one or more quantum dots. In some examples one or more or all of the pixel elements 502 can be direct LED emitters (i.e., the emitted light is the light produced by radiative recombination of charge carriers in the LED). In some examples one or more or all of the pixel elements 500 can include a wavelength-converting structure (e.g., a phosphor converter). In some examples the multiple pixel elements 502 can be integrally formed together on a common array substrate 501; in some other examples the multiple pixel elements 502 can comprise discrete elements 502 assembled together onto a common array substrate 501. In some examples the light-emitting array 500 can include lateral light barriers (not shown) at least partly blocking light transmission between adjacent pixel elements of the array 500.

The primary optics array 600 includes multiple metastructured primary optical elements 602. For purposes of the present description and appended claims, a "metastructured" optical element is an optical element that includes a multitude of wavelength-scale or sub-wavelength-scale structural elements (referred to hereinafter as metastructures; the description of this paragraph shall apply to any metastructures mentioned or described herein). Examples of metastructures can include, but are not limited to, one or more of: multitudes of suitably sized and shaped projections, holes, depressions, inclusions, or structures; an array of nano-antennae; a partial photonic bandgap structure; a photonic crystal; an array of meta-atoms or meta-molecules; or a multi-layer dielectric thin film. In some examples the metastructures can be arranged (i.e., sized, shaped, or spaced relative to the corresponding output wavelength) so as redirect corresponding portions of the output light to collectively impart one or more desired optical properties (e.g., effective focal length, beam-steering angle, beam angular radiative distribution, incidence-angle-dependent optical transmission, transmissive redirection, or other). In some examples the metastructures can include one or more materials among: one or more metals or metal alloys; doped or undoped silicon; one or more doped or undoped III-V, II-VI, or Group IV semiconductors; doped or undoped silicon oxide, nitride, or oxynitride; one or more doped or undoped metal oxides, nitrides, or oxynitrides; one or more doped or undoped semiconductor oxides, nitrides, or oxynitrides; one or more optical glasses; or one or more doped or undoped polymers.

Each primary optical element 602 of the primary optics array 600 differs from at least one other primary optical element 602 of the primary optics array 600 with respect to structural arrangement of their corresponding metastructures. Each primary optical element 602 receives pixel output light from at least one corresponding pixel element 502 and redirects (as described above) at least a portion of that received pixel output light to form a corresponding portion of array output light. Portions of pixel output light emitted by multiple pixel elements 500 and redirected by corresponding multiple metastructured optical elements 602 collectively constitute the array output light, i.e., the output light of the inventive light-emitting apparatus. Inventive arrangements of the light-emitting array 500 and the primary optics array 600 (described in further detail below) enable manipulation or control of spectral or spatial characteristics of that array output light.

In some examples nonzero spacing of the optical elements 602 of the array 600 can be less than 1.0 mm, less than 0.50 mm, less than 0.33 mm, less than 0.20 mm, less than 0.10 mm, less than 0.08 mm, less than 0.05 mm, less than 0.033 mm, less than 0.020 mm, or less than 0.010 mm. In some examples (including those illustrated schematically in the drawings) there can be a one-to-one correspondence between pixel elements 502 of the array 500 and primary optical elements 602 of the array 600; in those examples spacing of the pixel elements 502 of the array 500 can match the spacing of the optical elements 602 of the array 600. In some examples the transverse extent of each metastructured primary optical element 602 can be greater than about 1.5 times, 2.0 times, 3.0 times, or 5.0 times transverse extent of the corresponding pixel element 502; in some other examples the transverse extent of each metastructured primary optical element 602 can be about equal to transverse extent of the corresponding pixel element 502.

In some examples the pixel elements 502 of the array 500 can exhibit a contrast ratio, for output light exiting from corresponding primary optical elements 602, that is greater than 5:1, greater than 10:1, greater than 20:1, greater than 50:1, greater than 100:1, or greater than 300:1.

Each primary optical element 602 of the array 600 differs from at least one other primary optical element 602 of the array 600 with respect to structural arrangement of their corresponding metastructures. In some examples (e.g., as in FIGS. 7B, 7C, 8, and 9) those differing arrangements can result in differing collimation, propagation directions, or angular radiation distributions of the corresponding portions of array output light emitted by different pixel elements 502 of the light-emitting array (for the same wavelength, e.g., as in FIGS. 7B and 8, or at different wavelength, e.g., as in FIGS. 7C and 9). In some examples (e.g., FIGS. 7A, 7C, 9, and 10), each primary optical element 602 of the array 600, that receives pixel output light at a corresponding one of the multiple output wavelengths, differs from at least one other primary optical element 602 of the array 600, that receives pixel output light at a different corresponding one of the multiple output wavelengths, with respect to structural arrangement of corresponding metastructures thereof (to produce the same collimation, propagation direction, or angular distribution, e.g., as in FIGS. 7A and 10, or to produce different collimation, propagation direction, or angular distribution, e.g., as in FIGS. 7C and 9).

In some examples the primary optics array 600 is spaced apart from emission surfaces of the pixel elements 502 of the light-emitting array 500. In some examples (not shown) the corresponding metastructures of the primary optical elements can be positioned at a surface of a transparent primary optics substrate 601. Metastructures positioned "at" a surface can protrude away from that surface in either or both directions (i.e., into either one or both media in direct contact at the surface), or can be located entirely within one medium or the other separated from the surface by only a thin layer (e.g., a few wavelengths of the output wavelength) of that medium. In some examples the primary optics substrate 601 can include one or more materials among: doped or undoped silicon oxide, nitride, or oxynitride; one or more doped or undoped semiconductor oxides, nitrides, or oxynitrides; one or more doped or undoped metal oxides, nitrides, or oxynitrides; one or more optical glasses; or one or more doped or undoped polymers.

In some examples the metastructures of the primary optical elements 602 can be positioned at the surface of the substrate 601 that faces the emission surfaces of the pixel elements 502. In some of those examples the space between the emission surfaces and the substrate 601 can include lateral light barriers (not shown) that at least partly block output light emitted by one pixel element 500 from exiting through the primary optical element 602 corresponding to a different pixel element 502 (e.g., to reduce cross-talk between pixel elements 502).

In some examples the metastructures of the primary optical elements 602 can be positioned at the surface of the transparent primary optics substrate 601 that faces away from the emission surfaces of the pixel elements 502. In some of those examples (e.g., as in FIGS. 7A-7C) the primary optics substrate 601 can be positioned against emission surfaces of the pixel elements 502, so that the primary optics array 600 is spaced apart from the emission surfaces by thickness of the primary optics substrate 601. In some examples with the primary optical elements 602 on the substrate surface facing away from the emission surface of the pixel element 502, the primary optics substrate 601 can include lateral light barriers (not shown) that at least partly block output light emitted by one pixel element 500 from exiting through the primary optical element 602 corresponding to a different pixel element 502 (e.g., to reduce cross-talk between pixel elements 502). In some examples that include lateral light barrier (within the substrate 601 or between the substrate 601 and the emission surface of the pixel elements 502), those lateral light barriers can include one or more of optical reflectors, optical scatterers, or optical absorbers.

In some examples the primary optics substrate 601 can be divided into multiple different segments, each having positioned thereon one or more of the primary optical elements 602. In some examples (e.g., as in FIGS. 7A-7C) the primary optics substrate 601 can be divided into multiple different segments, each having positioned thereon only a single one of the primary optical elements 602. In some examples the primary optical substrate 601 can be a single, contiguous substrate on which are positioned all of the primary optical elements 602.

In some examples, the light-emitting apparatus can include a metastructured angular filter between the metastructured optical elements 602 and the emission surfaces of the pixel elements 502. In some examples an angular filter can be positioned at the emission surface of the pixel elements 502; in some other examples the angular filter can be positioned on a surface of the primary optical element substrate 601 that faces the emission surfaces. In some examples the angular filter can be arranged so as to exhibit incidence-angle-dependent optical transmission of the corresponding pixel output light at the corresponding output wavelength that decreases with increasing angle of incidence or that has a cutoff angle of incidence above which optical transmission is substantially prevented. In addition, in some examples the angular filter can also be arranged so as to result in transmissive redirection of pixel output light exiting the corresponding pixel element to propagate at an angle less than a corresponding incident angle or refracted angle. Such angular filters are disclosed in, e.g., U.S. Pat. No. 11,041,983, which is incorporated herein by reference in its entirety. By employing such an angular filter, the fraction of pixel output light that reaches the corresponding primary optical element 602 can be increased.

In some examples each metastructured primary optical element 602 can include a metastructured lens, each being characterized by a corresponding effective focal length. The metastructures of the metastructured lenses can include one or more of: multitudes of suitably sized and shaped projections, holes, depressions, inclusions, or structures; arrays of nano-antennae; partial photonic bandgap structures; photonic crystals; or arrays of meta-atoms or meta-molecules. The metastructures of each metastructured lens can be arranged relative to the corresponding output wavelength so as to collectively impart on the pixel output light a transverse-position-dependent phase delay that results in the corresponding effective focal length, e.g., phase delay varying quadratically in one or both transverse dimensions. Examples of metastructured lenses are disclosed in, e.g., U.S. Pat. No. 10,996,451, which is incorporated herein by reference in its entirety.

In some examples the primary optics array 600 can be spaced apart from the light-emitting array 500 by an effective spacing, between an emission surfaces of each pixel element 502 and the corresponding metastructured lens, that can be greater than or equal to the corresponding effective focal length. Such an arrangement can in some instances enable desired imaging or collimation to be achieved or otherwise facilitate production of a desired far-field illumination pattern. In some examples each effective focal length can be less than 2.0 mm, less than 1.5 mm, less than 1.0 mm, less than 0.8 mm, or less than 0.5 mm. In some examples each metastructured lens can be characterized by a numerical aperture (NA) greater than 0.5, greater than 0.7, greater than 1.0, or greater than 1.5. In some examples, different metastructured lenses of the array 600 can have differing arrangements of their corresponding metastructures, so that those lenses exhibit different effective focal lengths. In some examples, different metastructured lenses of the array 600, which receive different corresponding output wavelengths, can have differing arrangements of their corresponding metastructures, so that those lenses can exhibit the same effective focal length despite receiving different corresponding wavelengths.

Figure 13:
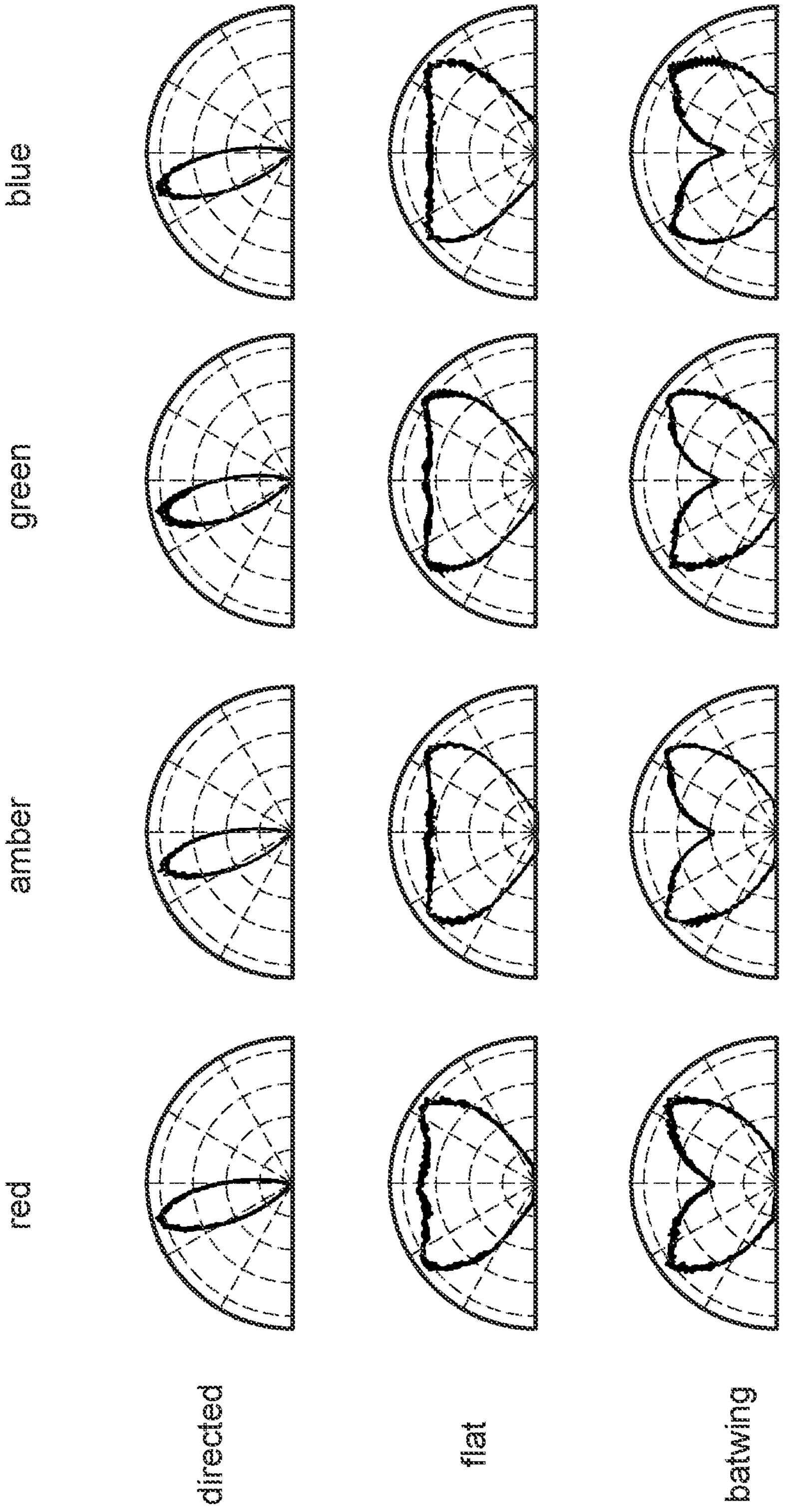
FIG. 13 shows plots of three different angular radiative distributions for four different output wavelengths.

In some examples each metastructured primary optical element 602 can include a metastructured beam-steering or beam-shaping element, each being characterized by a corresponding steering angle or angular radiative distribution (e.g., as in FIG. 13, showing examples of directional, flat, and batwing angular distributions at four different wavelengths). The metastructures of the beam-steering or beam-shaping elements can include one or more of: multitudes of suitably sized and shaped projections, holes, depressions, inclusions, or structures; arrays of nano-antennae; partial photonic bandgap structures; photonic crystals; or arrays of meta-atoms or meta-molecules. The metastructures of each metastructured beam-steering or beam-shaping element can be arranged relative to the corresponding output wavelength so as to collectively impart on the output light a transverse-position-dependent phase delay that results in the corresponding steering angle or angular radiative distribution. In some examples a metastructured lens can also serve as a beam steering element, e.g., by off-axis positioning of the lens relative to the corresponding pixel element 502. In other examples beam steering or shaping can be achieved using other suitable position-dependent phase delay, e.g., a linearly varying phase delay.

In some examples one or more or all primary optical elements 602 can be arranged to provide a relatively narrow angular distribution (e.g., ±10°) of radiated intensity at a selected propagation direction. Examples of such directional distributions are shown in FIG. 13. In some examples, one or more or all primary optical elements 602 can be arranged to provide a so-call flat distribution, i.e., relatively constant radiative intensity out to an angle (e.g., ±40°) beyond which intensity drops rapidly to a minimum (in some cases near zero). Examples of such flat distributions are shown in FIG. 13. In some examples, one or more or all primary optical elements 602 can be arranged to provide a so-call bat-wing distribution, i.e., nonzero local minimum of radiative intensity normal to the emission surface, increasing radiative intensity out to an angle (e.g., ±40°) beyond which intensity then decreases to a minimum (in some cases near zero). Examples of such batwing distributions are shown in FIG. 13. In some examples other radiative distributions can be constructed using multiple pixel elements 502 and corresponding optical elements 602 exhibiting these or other single-element radiative distributions superimposed on one another to yield a desired illumination pattern that might not be obtainable from a single pixel element 502 and single corresponding metastructured optical element 602.

In some examples different metastructured beam-steering or beam-shaping elements of the array 600 can have differing arrangements of their corresponding metastructures, so that those elements exhibit different collimation, steering angles, or angular radiative distributions (e.g., as in FIGS. 7B, 7C, 8, and 9), at the same wavelength or at different wavelengths. In some examples, different metastructured optical elements of the array 600, which receive different corresponding output wavelengths, can have differing arrangements of their corresponding metastructures, so that those elements can exhibit the same steering angles or the same angular radiative distributions despite receiving different corresponding wavelengths (e.g., as in FIGS. 7A and 10).

In some examples the light-emitting array 500 can be arranged so that each pixel element 502 is operable independently of one or more or all other pixel elements 502 of the array 500. The light-emitting and primary optics arrays 500/600 can be arranged so that far-field imaging, beam steering, or beam shaping of the array output light by the primary optics array results in a corresponding far-field illumination pattern, and so that selective activation of one or more different individual pixel elements 502 results in different corresponding far-field illumination patterns. The light-emitting apparatus can further include a drive circuit 302 connected to the light-emitting array 500. The drive circuit can be arranged to enable independent operation or selective activation of the pixel elements 502 of the array 500, in turn enabling selection of one of multiple different far-field illumination patterns or different colors.

In some examples the multiple pixel elements 502 of the light-emitting array 500 can include multiple pixel subsets. The multiple pixel elements 502 of each subset can be electrically coupled so as to be operable in unison with one another; the light-emitting array 500 can be further arranged so that each pixel subset is operable independently of every other pixel subset. In some examples (including those shown in FIGS. 8 and 9) each subset of pixel elements can form a contiguous subarray of pixel elements 502 within the array

500. In some other examples (including that shown in FIG. 10) the pixel elements 502 of each subset can be interspersed across the array 500 among pixel elements 502 of other subsets.

In some examples, one or more or all of the pixel subsets can each correspond to primary optical elements 602 that all exhibit the same corresponding effective focal length, steering angle, or angular radiative distribution. In some of those examples each such pixel subset differs from at least one other pixel subset with respect to the corresponding effective focal length, steering angle, or angular radiation distribution. In some of such latter examples wherein all pixel elements 502 of all subsets emit at a single, common output wavelength (e.g., as in FIG. 8), selective activation of different pixel subsets result in different far field illumination patterns of a single color, i.e., the color of the single output wavelength. In some others of such latter examples, wherein each pixel subset includes the same numbers of pixel elements 502 emitting each of multiple different output wavelengths at the same relative power levels (e.g., as in FIG. 9), selective activation of different pixel subsets results in different far field illumination patterns of a single color, i.e., the composite color resulting from the multiple different output wavelengths, the composite color being the same across all pixel subsets. In still some others of such latter examples, wherein each pixel subset includes differing numbers of pixel elements 502 emitting each of multiple different output wavelengths (not shown), selective activation of different pixel subsets results in different far-field illumination patterns and different colors as well. Which combinations of color and illumination pattern are available can be determined by the particular spectral and spatial properties are present in the light-emitting and primary optics arrays 500 and 600, and the particular grouping of those into different pixel subsets. Myriad combinations can be contrived, and all fall within the scope of the present disclosure or appended claims.

In some examples, one or more or all of the pixel subsets can each include pixel elements 502 that all emit output light at the same corresponding output wavelength. In some of those examples each such pixel subset differs from at least one other pixel subset with respect to the corresponding output wavelength. In some of such latter examples wherein all corresponding primary optical elements 602 of all subsets exhibit the same effective focal length, steering angle, or angular radiative distribution (e.g., as in FIG. 10), selective activation of different pixel subsets result in the same far field illumination pattern of varying colors, i.e., the color of the output wavelength of the activated pixel subsets of a single color (e.g., as in FIG. 10) or a composite color arising from a mixture of activated pixel subsets of different colors. On some others of such latter examples, wherein each pixel element 502 of each subset corresponds to the same numbers and types of primary optical elements 602 so that each pixel subset exhibits the same composite angular radiative distribution as the others (not shown), selective activation of different pixel subsets results in the same far field illumination pattern of varying composite colors (depending on the mixture of output wavelengths among the activated pixel subsets). In still some others of such latter examples, wherein each pixel element 502 of each subset corresponds to different numbers and types of primary optical elements 602 so that each pixel subset exhibits a corresponding composite angular radiative distribution different from other pixel subsets (not shown), selective activation of different pixel subsets results in different far-field illumination patterns and different colors as well. Which combinations of color and illumination pattern are available can be determined by the particular spectral and spatial properties are present in the light-emitting and primary optics arrays 500 and 600, and the particular grouping of those into different pixel subsets. Myriad combinations can be contrived, and all fall within the scope of the present disclosure or appended claims.

In some examples the light-emitting array 500 can be arranged so that each pixel subset is operable independently of other pixel subsets of the array 500. The light-emitting and primary optics arrays 500/600 can be arranged so that far-field imaging, beam steering, or beam shaping of the array output light by the primary optics array results in a corresponding far-field illumination pattern, and so that selective activation of one or more different pixel subsets results in different corresponding far-field illumination patterns. The light-emitting apparatus can further include a drive circuit 302 connected to the light-emitting array 500. The drive circuit can be arranged to enable independent operation or selective activation of the pixel subsets the array 500, in turn enabling selection of one of multiple different far-field illumination patterns or different colors.

The various different far-field illumination patterns can differ from one another with respect to one or more of collimation, propagation directions, or angular radiation distributions. Some examples can include one or more directed distributions, one or more flat distributions, one or more batwing distributions, or combinations thereof. In some examples far-field illumination patterns or color or both can be static, by fixed operation of pixel elements 502 or pixel subsets of a given light-emitting array 500. In some examples far-field illumination patterns or color or both can be dynamically varied, by dynamically varying selective operation of pixel elements 502 or pixel subsets of the array 500.

Figure 14A:
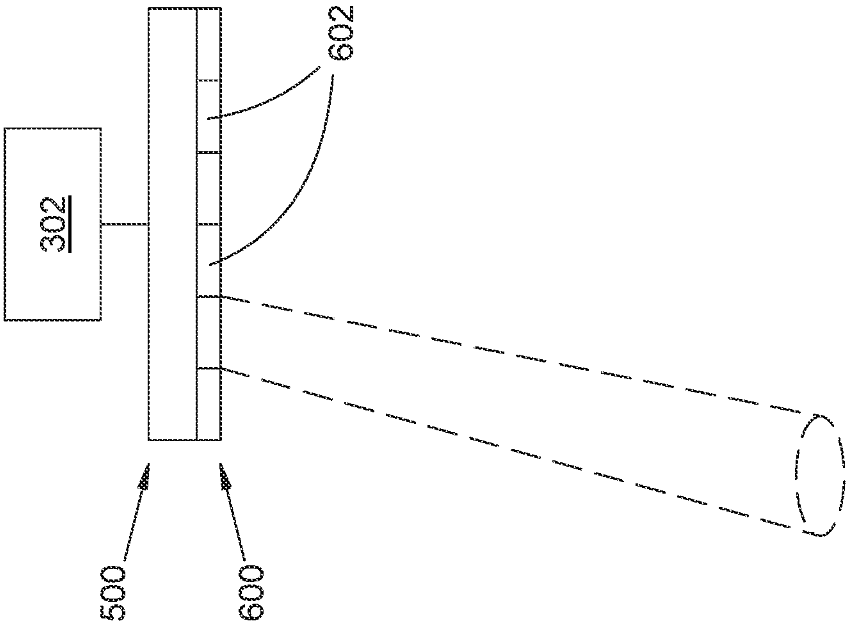
FIGS. 14A and 14B are schematic representations of two different directional distributions produced by two different subsets of pixel elements.
Figure 14B:
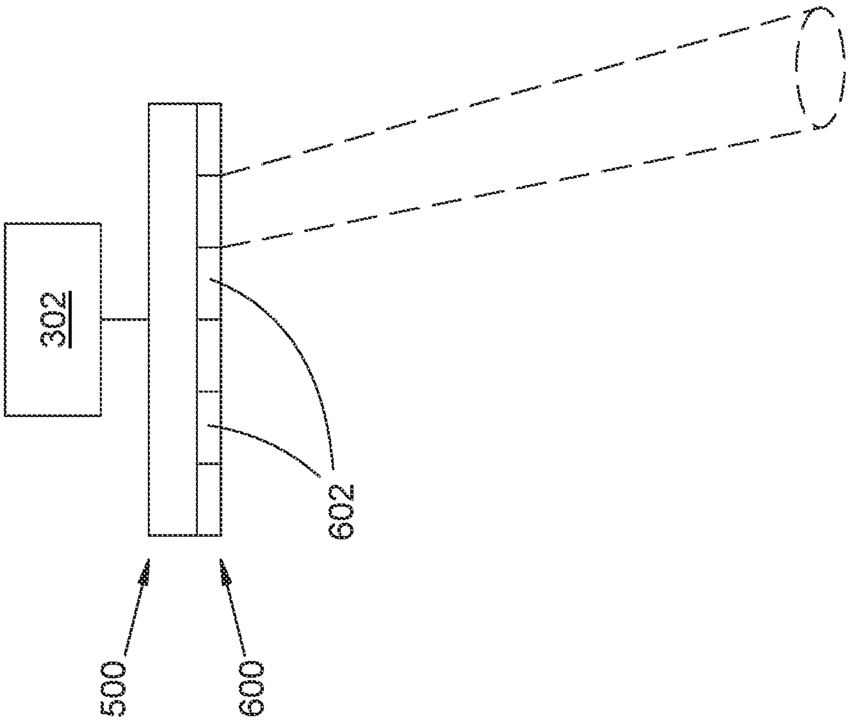

In some examples (e.g., as in FIGS. 14A and 14B) the far-field illumination pattern can including patterns with one or more localized intensity maxima, e.g., as a spotlight or task light. Such localized maxima can be realized using a single directional distribution, or a few closely spaced direction distributions. The illumination maximum can be swept by successively activating and deactivating different pixel elements 502 or pixel subsets having suitable corresponding primary optical elements 602 (e.g., for following a pedestrian with adaptive street lighting). In some examples the far-field illumination pattern can include one or more localized intensity minima, e.g., as in an adaptive automotive headlight (e.g., to avoid blinding oncoming drivers) or an adaptive camera flash (e.g., to reduce facial illumination for red-eye reduction or to avoid dazzling the subject). Such intensity minima can be realized using a batwing distribution, or by using a set of multiple different directional distributions for generating a composite flat distribution and then dropping out one or more of those in the desired location of the local minimum. The illumination minimum can be swept by successively deactivating and reactivating different directional pixel elements 502 or pixel subsets. Myriad other adaptive illumination schemes can be contrived, and shall fall within the scope of the present disclosure or appended claims. In some instances the apparatus can include one or more sensors operatively coupled to the drive circuit 302, the pixel elements 502 or pixel subsets can be selectively activated or deactivated based on signals from those sensors. Examples of suitable sensors can include, e.g., motion sensors for adaptive street or environmental lighting, image sensors with facial recognition for adaptive camera flash, or radar, lidar, or image sensors for oncoming vehicle detection, or any other suitable sensors for other suitable use scenarios.

Design or optimization one or more or all of the metastructured primary optical elements 602 can be performed (by calculation, simulation, or iterative designing/making/testing of prototypes or test devices) based on one or more selected figures-of-merit (FOMs). Device-performance-based FOMs that can be considered can include, e.g.: (i) sufficiently low color variation or artifacts; (ii) accuracy of far-field illumination patterns produced; (iii) angular radiative distribution of the array output light; (iv) contrast ratio between adjacent pixel elements 502, or (v) other suitable or desirable FOMs. Instead or in addition, reduction of cost or manufacturing complexity can be employed as an FOM in a design or optimization process. Optimization for one FOM can result in non-optimal values for one or more other FOMs. Note that a device that is not necessarily fully optimized with respect to any FOM can nevertheless provide acceptable enhancement of one or more FOMs; such partly optimized devices fall within the scope of the present disclosure or appended claims.

In addition to the preceding, the following example embodiments fall within the scope of the present disclosure or appended claims:

Example 1. A light-emitting apparatus comprising: (a) a light-emitting array of multiple light-emitting pixel elements, each light-emitting pixel element emitting corresponding pixel output light at a corresponding one of one or more output wavelengths; and (b) a primary optics array of multiple metastructured primary optical elements arranged so that each primary optical element receives pixel output light from at least one corresponding pixel element and redirects at least a portion of that received pixel output light to form a corresponding portion of array output light, the pixel element corresponding to each primary optical element differing from the pixel element corresponding to at least one other primary optical element, (c) each primary optical element of the primary optics array differing from at least one other primary optical element of the primary optics array with respect to structural arrangement of corresponding metastructures thereof that results in differing collimation, propagation directions, or angular radiation distributions of the corresponding portions of array output light emitted by different pixel elements of the light-emitting array.

Example 2. The apparatus of Example 1, all of the pixel elements emitting pixel output light at a single, common output wavelength.

Example 3. The apparatus of Example 2, the output wavelength being greater than 0.20 μm, greater than 0.4 μm, greater than 0.8 μm, less than 10. μm, less than 2.5 μm, or less than 1.0 μm.

Example 4. The apparatus of Example 1, each pixel element emitting corresponding pixel output light at a corresponding one of multiple different output wavelengths.

Example 5. A light-emitting apparatus comprising: (a) a light-emitting array of multiple light-emitting pixel elements, each light-emitting pixel element emitting corresponding pixel output light at a corresponding one of multiple different output wavelengths; and (b) a primary optics array of multiple metastructured primary optical elements arranged so that each primary optical element receives pixel output light from at least one corresponding pixel element and redirects at least a portion of that received pixel output light to form a corresponding portion of array output light, the pixel element corresponding to each primary optical element differing from the pixel element corresponding to at least one other primary optical element, (c) each primary optical element of the primary optics array, that receives pixel output light at a corresponding one of the multiple output wavelengths, differing from at least one other primary optical element of the primary optics array, that receives pixel output light at a different corresponding one of the multiple output wavelengths, with respect to structural arrangement of corresponding metastructures thereof.

Example 6. The apparatus of Examples 4 or 5, each one of the multiple output wavelengths being greater than 0.20 μm, greater than 0.4 μm, greater than 0.8 μm, less than 10. μm, less than 2.5 μm, or less than 1.0 μm.

Example 7. The apparatus of any one of Examples 4 through 6, the multiple output wavelengths including 3, 4, 5, or more different output wavelengths.

Example 8. The apparatus of any one of Examples 4 through 7, the multiple output wavelengths including red, green, and blue wavelengths.

Example 9. The apparatus of any one of Examples 4 through 8, the multiple output wavelengths including red, green, amber, and blue wavelengths.

Example 10. The apparatus of any one of Examples 4 through 9, the multiple output wavelengths including a first output wavelength between 455 nm and 465 nm, a second output wavelength between 533 nm and 543 nm, a third wavelength between 580. nm and 590. nm, and a fourth wavelength between 608 nm and 618 nm.

Example 11. The apparatus of any one of Examples 1 through 10, each pixel element including a corresponding semiconductor light-emitting diode (LED).

Example 12. The apparatus of Example 11, each LED including one or more doped or undoped III-V, II-VI, or Group IV semiconductor materials or alloys or mixtures thereof.

Example 13. The apparatus of any one of Examples 11 or 12, each LED including one or more p-n junctions, one or more quantum wells, one or more multi-quantum wells, or one or more quantum dots.

Example 14. The apparatus of any one of Examples 11 through 13, one or more of the pixel elements being direct LED emitters.

Example 15. The apparatus of Example 13, all of the pixel elements being direct LED emitters.

Example 16. The apparatus of any one of Examples 11 through 13, one or more of the pixel elements including a wavelength-converting structure.

Example 17. The apparatus of Example 16, all of the pixel elements including a wavelength-converting structure.

Example 18. The apparatus of any one of Examples 1 through 17, each primary optical element receiving pixel output light from only one corresponding pixel element.

Example 19. The apparatus of any one of Examples 1 through 18, the multiple pixel elements being integrally formed together on a common array substrate.

Example 20. The apparatus of any one of Examples 1 through 19, the multiple pixel elements comprising discrete elements assembled together onto a common array substrate.

Example 21. The apparatus of any one of Examples 1 through 20, the light-emitting array including lateral light barriers at least partly blocking light transmission between adjacent pixel elements of the array.

Example 22. The light-emitting array of any one of Examples 1 through 21, nonzero spacing of the pixel elements of the array being less than 1.0 mm, less than 0.50 mm, less than 0.33 mm, less than 0.20 mm, less than 0.10 mm, less than 0.08 mm, less than 0.05 mm, less than 0.033 mm, less than 0.020 mm, or less than 0.010 mm.

Example 23. The apparatus of any one of Examples 1 through 22, transverse extent of each metastructured primary optical element being greater than about 1.5 times, 2.0 times, 3.0 times, or 5.0 times transverse extent of the corresponding pixel element.

Example 24. The apparatus of any one of Examples 1 through 22, transverse extent of each metastructured primary optical element being about equal to transverse extent of the corresponding pixel element.

Example 25. The light-emitting array of any one of Examples 1 through 24, the pixel elements of the array exhibiting a contrast ratio for array output light exiting from corresponding primary optical elements that is greater than 5:1, greater than 10:1, greater than 20:1, greater than 50:1, greater than 100:1, or greater than 300:1.

Example 26. The apparatus of any one of Examples 1 through 25, the primary optics array being spaced apart from emission surfaces of the pixel elements of the light-emitting array.

Example 27. The apparatus of Example 26, the metastructures of the primary optical elements being positioned at a surface of a transparent primary optics substrate that faces the emission surfaces of the pixel elements.

Example 28. The apparatus of Example 27, space between the emission surfaces and the substrate including lateral light barriers arranged so as to at least partly block output light emitted by one of the pixel element from propagating to a primary optical element corresponding to a different pixel element.

Example 29. The apparatus of Example 26, the metastructures of the primary optical elements being positioned at a surface of a transparent primary optics substrate that faces away from the emission surfaces of the pixel elements.

Example 30. The apparatus of Example 29, the primary optics substrate being positioned against emission surfaces of the pixel elements of the light-emitting array so that the primary optics array is spaced apart from the emission surfaces by thickness of the primary optics substrate.

Example 31. The apparatus of any one of Examples 26 through 30, the primary optics substrate being divided into multiple different segments, each having positioned thereon one or more of the primary optical elements.

Example 32. The apparatus of any one of Examples 26 through 30, the primary optics substrate being divided into multiple different segments, each having positioned thereon only a single one of the primary optical elements.

Example 33. The apparatus of any one of Examples 26 through 30, the primary optical substrate being a single, contiguous substrate on which are positioned all of the primary optical elements.

Example 34. The apparatus of any one of Examples 26 through 33, the primary optics substrate including lateral light barriers arranged so as to at least partly block output light emitted by one of the pixel element from propagating to a primary optical element corresponding to a different pixel element.

Example 35. The apparatus of any one of Examples 28 or 34, the lateral light barriers including one or more optical reflectors, optical scatterers, or optical absorbers.

Example 36. The apparatus of any one of Examples 26 through 35, the primary optics substrate including one or more materials among: doped or undoped silicon oxide, nitride, or oxynitride; one or more doped or undoped semiconductor oxides, nitrides, or oxynitrides; one or more doped or undoped metal oxides, nitrides, or oxynitrides; one or more optical glasses; or one or more doped or undoped polymers.

Example 37. The apparatus of any one of Examples 29 through 36, further comprising metastructured angular filters positioned at a surface of the primary optics substrate opposite the surface at which corresponding primary optical elements of the array are formed, each angular filter being arranged so as to exhibit incidence-angle-dependent optical transmission of the corresponding pixel output light at the corresponding output wavelength that decreases with increasing angle of incidence or that has a cutoff angle of incidence above which optical transmission is substantially prevented.

Example 38. The apparatus of any one of Examples 1 through 37, further comprising metastructured angular filters positioned at emission surfaces of corresponding pixel elements of the array, each angular filter being arranged so as to exhibit incidence-angle-dependent optical transmission of the corresponding pixel output light that decreases with increasing angle of incidence or that has a cutoff angle of incidence above which optical transmission is substantially prevented.

Example 39. The apparatus of any one of Examples 37 or 38, each angular filter being arranged so as to result in transmissive redirection of pixel output light exiting the corresponding pixel element to propagate at an angle less than a corresponding incident angle or refracted angle.

Example 40. The apparatus of any one of Examples 37 through 39, metastructures of each angular filter including one or more of: multitudes of suitably sized and shaped projections, holes, depressions, inclusions, or structures; an array of nano-antennae; a partial photonic bandgap structure; a photonic crystal; an array of meta-atoms or meta-molecules; or a multi-layer dielectric thin film, the metastructures of each angular filter being arranged relative to the corresponding output wavelength so as to collectively effect the incidence-angle-dependent optical transmission or the transmissive redirection.

Example 41. The apparatus of any one of Examples 1 through 40, each primary optical element including a metastructured lens, each being characterized by a corresponding effective focal length.

Example 42. The apparatus of Example 41, the primary optics array being spaced apart from the light-emitting array, effective spacing between an emission surfaces of each pixel element and the corresponding metastructured lens being greater than or equal to the corresponding effective focal length.

Example 43. The apparatus of any one of Examples 41 or 42, each effective focal length being less than 2.0 mm, less than 1.5 mm, less than 1.0 mm, less than 0.8 mm, or less than 0.5 mm.

Example 44. The apparatus of any one of Examples 41 through 43, each metastructured lens being characterized by a numerical aperture (NA) greater than 0.5, greater than 0.7, greater than 1.0, or greater than 1.5.

Example 45. The apparatus of any one of Examples 41 through 44, metastructures of the metastructured lenses including one or more of: multitudes of suitably sized and shaped projections, holes, depressions, inclusions, or structures; arrays of nano-antennae; partial photonic bandgap structures; photonic crystals; or arrays of meta-atoms or meta-molecules, the metastructures of each metastructured lens being arranged relative to the corresponding output wavelength so as to collectively impart on the pixel output light a transverse-position-dependent phase delay that results in the corresponding effective focal length.

Example 46. The apparatus of Example 45, the corresponding metastructured lens of at least one pixel element, which has a corresponding output wavelength different from at least one other pixel element, having an arrangement of corresponding metastructures different from that of the corresponding metastructured lens of that other pixel element, so as to exhibit the same corresponding effective focal length as the corresponding metastructured lens of that other pixel element.

Example 47. The apparatus of Example 45, the metastructured lens of at least one corresponding pixel element having a structural arrangement of the corresponding metastructures different from that of the corresponding metastructured lens of at least one other pixel element so as to exhibit a different corresponding effective focal length from that of the corresponding metastructured lens of that other pixel element.

Example 48. The apparatus of any one of Examples 1 through 47, each primary optical element including a metastructured beam-steering or beam-shaping element, each being characterized by a corresponding steering angle or angular radiative distribution.

Example 49. The apparatus of Example 48, metastructures of the beam-steering or beam-shaping elements including one or more of: multitudes of suitably sized and shaped projections, holes, depressions, inclusions, or structures; arrays of nano-antennae; partial photonic bandgap structures; photonic crystals; or arrays of meta-atoms or metamolecules, the metastructures of each metastructured beam-steering or beam-shaping element being arranged relative to the corresponding output wavelength so as to collectively impart on the output light a transverse-position-dependent phase delay that results in the corresponding steering angle or angular radiative distribution.

Example 50. The apparatus of Example 49, the corresponding metastructured beam-steering or beam-shaping element of at least one pixel element, which has a corresponding output wavelength different from at least one other pixel element, having an arrangement of corresponding metastructures different from that of the corresponding metastructured beam-steering or beam-shaping element of that other pixel element, so as to exhibit the same corresponding steering angle or angular radiative distribution as the corresponding metastructured beam-steering or beam-shaping element of that other pixel element.

Example 51. The apparatus of Example 49, the metastructured beam-steering or beam-shaping element of at least one corresponding pixel element having a structural arrangement of the corresponding metastructures different from that of the corresponding metastructured beam-steering or beam-shaping element of at least one other pixel element so as to exhibit a different corresponding steering angle or angular radiative distribution from that of the corresponding metastructured beam-steering or beam-shaping element of that other pixel element.

Example 52. The apparatus of any one of Examples 1 through 51, the metastructures including one or more materials among: one or more metals or metal alloys; doped or undoped silicon; one or more doped or undoped III-V, II-VI, or Group IV semiconductors; doped or undoped silicon oxide, nitride, or oxynitride; one or more doped or undoped metal oxides, nitrides, or oxynitrides; one or more doped or undoped semiconductor oxides, nitrides, or oxynitrides; one or more optical glasses; or one or more doped or undoped polymers.

Example 53. The apparatus of any one of Examples 1 through 52, the light-emitting array being arranged so that each pixel element of the array is operable independently of one or more other pixel elements of the array.

Example 54. The apparatus of any one of Examples 1 through 53, the light-emitting array being arranged so that each pixel element of the array is operable independently of every other pixel element of the array.

Example 55. The apparatus of any one of Examples 53 or 54, the light-emitting and primary optics arrays being arranged so that far-field imaging, beam steering, or beam shaping of the array output light by the primary optics array results in a corresponding far-field illumination pattern, and so that selective activation of one or more different individual pixel elements results in different corresponding far-field illumination patterns.

Example 56. The apparatus of any one of Examples 53 through 55, further comprising a drive circuit connected to the light-emitting array and arranged so as to enable independent operation or selective activation of the pixel elements of the array.

Example 57. The apparatus of any one of Examples 1 through 56, the multiple pixel elements of the light-emitting array including multiple pixel subsets, the multiple pixel elements of each subset being electrically coupled so as to be operable in unison with one another, the light-emitting array being arranged so that each pixel subset is operable independently of every other pixel subset.

Example 58. The apparatus of Example 57, one or more or all subsets of pixel elements forming corresponding contiguous subarrays of pixel elements within the array.

Example 59. The apparatus of Example 57 or 58, the pixel elements of one or more or all subsets being interspersed across the array among pixel elements of other subsets.

Example 60. The apparatus of any one of Examples 57 through 59 wherein, for one or more pixel subsets, all primary optical elements corresponding to the pixel elements of that subset are arranged to exhibit the same corresponding effective focal length, steering angle, or angular radiative distribution.

Example 61. The apparatus of any one of Examples 57 through 59 wherein, for each pixel subset, primary optical elements corresponding to the pixel elements of that subset are arranged to exhibit the same corresponding one or more effective focal lengths, steering angles, or angular radiative distributions, each such pixel subset differing from at least one other pixel subset with respect to one or more of the corresponding effective focal lengths, steering angles, or angular radiation distributions.

Example 62. The apparatus of any one of Examples 57 through 59 wherein all pixel elements of the array are arranged to exhibit the same corresponding effective focal length, steering angle, or angular radiative distribution.

Example 63. The apparatus of any one of Examples 57 through 62 wherein, for one or more pixel subsets, all pixel elements of that subset are arranged to emit output light at the same output wavelength.

Example 64. The apparatus of any one of Examples 57 through 62 wherein, for each pixel subset, pixel elements of that subset are arranged to emit output light at the same corresponding one or more output wavelengths, each such pixel subset differing from at least one other pixel subset with respect to one or more of the corresponding output wavelengths.

Example 65. The apparatus of any one of Examples 57 through 62 wherein all pixel elements of the array are arranged to emit output light at the same output wavelength.

Example 66. The apparatus of any one of Examples 57 through 65, the light-emitting and primary optics arrays being arranged so that far-field imaging, beam steering, or beam shaping of the array output light by the primary optics array results in a corresponding far-field illumination pattern, and so that selective activation of one or more different pixel subsets results in different corresponding far-field illumination patterns.

Example 67. The apparatus of any one of Examples 57 through 66, further comprising a drive circuit connected to the light-emitting array and arranged so as to enable independent operation or selective activation of the pixel subsets.

Example 68. The apparatus of any one of Examples 55, 56, 66, or 67, the different far-field illumination patterns differing from one another with respect to one or more of collimation, propagation directions, or angular radiation distributions.

Example 69. The apparatus of Example 68, the different far-field illumination patterns include one or more directed distributions, one or more flat distributions, one or more batwing distributions, or combinations thereof.

Example 70. The apparatus of any one of Examples 68 or 69, the different far-field illumination patterns including patterns with one or more localized intensity minima or maxima.

Example 71. The apparatus of Example 70, further comprising one or more sensors coupled to the drive circuit, the drive circuit being structured and programmed so as to selectively activate one or more pixel elements or subsets of pixel elements in response to signals from the one or more sensors so as to produce a selected far-field illumination pattern having one or more localized minima or maxima.

Example 72. The apparatus of Example 71, the sensor providing a signal to the drive circuit indicative of a sensed object located within the far-field illumination pattern, the drive circuit causing the far-field illumination pattern to exhibit either a localized minimum or a localized maximum at the location of the sensed object.

Example 73. A method for operating the apparatus of any one of Example 56 or Examples 67 through 72, the method comprising: (A) selectively activating a first subset of pixel elements, or a first group of one or more subsets of pixel elements, so as to produce a first far-field illumination pattern; and (B) selectively activating a second subset of pixel elements, different from the first subset, or a second group of subsets of pixel elements, different from the first group, so as to produce a second far-field illumination pattern different from the first far-field illumination pattern.

This disclosure is illustrative and not limiting. Further modifications will be apparent to one skilled in the art in light of the present disclosure and are intended to fall within the scope of the present disclosure or appended claims. It is intended that equivalents of the disclosed example embodiments and methods, or modifications thereof, shall fall within the scope of the present disclosure or appended claims.

In the foregoing Detailed Description, various features may be grouped together in several example embodiments for the purpose of streamlining the disclosure. This method of disclosure is not to be interpreted as reflecting an intention that any claimed embodiment requires more features than are expressly recited in the corresponding claim. Rather, as the appended claims reflect, inventive subject matter may lie in less than all features of a single disclosed example embodiment. Therefore, the present disclosure shall be construed as implicitly disclosing any embodiment having any suitable subset of one or more features—which features are shown, described, or claimed in the present application—including those subsets that may not be explicitly disclosed herein. A "suitable" subset of features includes only features that are neither incompatible nor mutually exclusive with respect to any other feature of that subset. Accordingly, the appended claims are hereby incorporated in their entirety into the Detailed Description, with each claim standing on its own as a separate disclosed embodiment. In addition, each of the appended dependent claims shall be interpreted, only for purposes of disclosure by said incorporation of the claims into the Detailed Description, as if written in multiple dependent form and dependent upon all preceding claims with which it is not inconsistent. It should be further noted that the cumulative scope of the appended claims can, but does not necessarily, encompass the whole of the subject matter disclosed in the present application.

The following interpretations shall apply for purposes of the present disclosure and appended claims. The words "comprising," "including," "having," and variants thereof, wherever they appear, shall be construed as open ended terminology, with the same meaning as if a phrase such as "at least" were appended after each instance thereof, unless explicitly stated otherwise. The article "a" shall be interpreted as "one or more" unless "only one," "a single," or other similar limitation is stated explicitly or is implicit in the particular context; similarly, the article "the" shall be interpreted as "one or more of the" unless "only one of the," "a single one of the," or other similar limitation is stated explicitly or is implicit in the particular context. The conjunction "or" is to be construed inclusively unless: (i) it is explicitly stated otherwise, e.g., by use of "either . . . or," "only one of," or similar language; or (ii) two or more of the listed alternatives are understood or disclosed (implicitly or explicitly) to be incompatible or mutually exclusive within the particular context. In that latter case, "or" would be understood to encompass only those combinations involving non-mutually-exclusive alternatives. In one example, each of "a dog or a cat," "one or more of a dog or a cat," and "one or more dogs or cats" would be interpreted as one or more dogs without any cats, or one or more cats without any dogs, or one or more of each. In another example, each of "a dog, a cat, or a mouse," "one or more of a dog, a cat, or a mouse," and "one or more dogs, cats, or mice" would be interpreted as (i) one or more dogs without any cats or mice, (ii) one or more cats without and dogs or mice, (iii) one or more mice without any dogs or cats, (iv) one or more dogs and one or more cats without any mice, (v) one or more dogs and one or more mice without any cats, (vi) one or more cats and one or more mice without any dogs, or (vii) one or more dogs, one or more cats, and one or more mice. In another example, each of "two or more of a dog, a cat, or a mouse" or "two or more dogs, cats, or mice" would be interpreted as (i) one or more dogs and one or more cats without any mice, (ii) one or more dogs and one or more mice without any cats, (iii) one or more cats and one or more mice without and dogs, or (iv) one or more dogs, one or more cats, and one or more mice; "three or more," "four or more," and so on would be analogously interpreted.

For purposes of the present disclosure or appended claims, when a numerical quantity is recited (with or without terms such as "about," "about equal to," "substantially equal to," "greater than about," "less than about," and so forth), standard conventions pertaining to measurement precision, rounding error, and significant digits shall apply, unless a differing interpretation is explicitly set forth. For null quantities described by phrases such as "substantially prevented,"

"substantially absent," "substantially eliminated," "about equal to zero," "negligible," and so forth, each such phrase shall denote the case wherein the quantity in question has been reduced or diminished to such an extent that, for practical purposes in the context of the intended operation or use of the disclosed or claimed apparatus or method, the overall behavior or performance of the apparatus or method does not differ from that which would have occurred had the null quantity in fact been completely removed, exactly equal to zero, or otherwise exactly nulled.

For purposes of the present disclosure and appended claims, any labelling of elements, steps, limitations, or other portions of an embodiment, example, or claim (e.g., first, second, third, etc., (a), (b), (c), etc., or (i), (ii), (iii), etc.) is only for purposes of clarity, and shall not be construed as implying any sort of ordering or precedence of the portions so labelled. If any such ordering or precedence is intended, it will be explicitly recited in the embodiment, example, or claim or, in some instances, it will be implicit or inherent based on the specific content of the embodiment, example, or claim. In the appended claims, if the provisions of 35 USC § 112(f) are desired to be invoked in an apparatus claim, then the word "means" will appear in that apparatus claim. If those provisions are desired to be invoked in a method claim, the words "a step for" will appear in that method claim. Conversely, if the words "means" or "a step for" do not appear in a claim, then the provisions of 35 USC § 112(f) are not intended to be invoked for that claim.

If any one or more disclosures are incorporated herein by reference and such incorporated disclosures conflict in part or whole with, or differ in scope from, the present disclosure, then to the extent of conflict, broader disclosure, or broader definition of terms, the present disclosure controls. If such incorporated disclosures conflict in part or whole with one another, then to the extent of conflict, the later-dated disclosure controls.

The Abstract is provided as required as an aid to those searching for specific subject matter within the patent literature. However, the Abstract is not intended to imply that any elements, features, or limitations recited therein are necessarily encompassed by any particular claim. The scope of subject matter encompassed by each claim shall be determined by the recitation of only that claim.

What is claimed is:

1. A light-emitting device comprising:

a light-emitting array having a plurality of light-emitting pixel elements that each emit corresponding pixel output light at a corresponding one of one or more output wavelengths, the light-emitting pixel elements being connected to form multiple distinct subsets with the pixel elements of each subset being operable in unison with one another, the subsets being independently operable; and a primary optics array having a plurality of metastructured primary optical elements that are each arranged so as to receive and redirect pixel output light from at least one corresponding pixel element of the light-emitting array to form a corresponding portion of illumination output light, structural arrangement of corresponding metastructures varying among the primary optical elements of the primary optics array, the illumination output light produced by operation of each subset differs from the illumination output light produced by operation of at least one other subset with respect to wavelength, collimation, propagation direction, or angular radiation distribution, and the light-emitting array and the primary optics array being arranged so that (i) far-field imaging, beam steering, or beam shaping of the illumination output light by the primary optics array results in a corresponding far-field illumination pattern, and (ii) selective operation of one or more different subsets results in different corresponding far-field illumination patterns.

2. The light-emitting device of claim 1, all of the pixel elements of the light-emitting array emitting pixel output light at a single output wavelength.

3. The light-emitting device of claim 1, all of the pixel elements of each subset emitting pixel output light at a single corresponding output wavelength that differs from a corresponding output wavelength of at least one other subset.

4. The light-emitting device of claim 1, pixel elements of at least one subset emitting corresponding pixel output light at multiple different output wavelengths.

5. The light-emitting device of claim 1, the output wavelengths including red, green, amber, and blue wavelengths.

6. The light-emitting device of claim 1, (i) each pixel element including a corresponding semiconductor light-emitting diode (LED), with one or more or all of the pixel elements being direct LED emitters; or (ii) each pixel element including a corresponding semiconductor light-emitting diode (LED), with one or more or all of the pixel elements including a wavelength-converting structure.

7. The light-emitting device of claim 1, a nonzero spacing of the pixel elements of the light-emitting array being less than 0.10 mm.

8. The light-emitting device of claim 1, the primary optics array being spaced apart from emission surfaces of the pixel elements of the light-emitting array by either (i) being positioned at a surface of a transparent primary optics substrate that is spaced apart from the emission surfaces of the pixel elements, or (ii) being positioned at a surface of a transparent primary optics substrate that faces away from the emission surfaces of the pixel elements, with the substrate positioned directly against the emission surfaces of the pixel elements.

9. The light-emitting device of claim 1 further comprising metastructured angular filters positioned at emission surfaces of corresponding pixel elements of the light-emitting array or between the emission surfaces and the primary optics array, each angular filter being arranged so as to exhibit one or both of (i) incidence-angle-dependent optical transmission of the corresponding pixel output light that decreases with increasing angle of incidence or that has a cutoff angle of incidence above which optical transmission is prevented, or (ii) transmissive redirection of pixel output light exiting the corresponding pixel element to propagate at an angle less than a corresponding incident angle or refracted angle.

10. The light-emitting device of claim 1, (i) each primary optical element including a metastructured lens, each being characterized by a corresponding effective focal length, (ii) metastructures of the metastructured lenses including one or more of: multitudes of suitably sized and shaped projections, holes, depressions, inclusions, or structures; arrays of nanoantennae; partial photonic bandgap structures; photonic crystals; or arrays of meta-atoms or meta-molecules, (iii) the metastructures of each metastructured lens being arranged relative to a corresponding output wavelength so as to collectively impart on the pixel output light a transverse-position-dependent phase delay that results in the corresponding effective focal length, and (iv) at least one metastructured lens having a structural arrangement of corresponding metastructures thereof different from that of at least one other metastructured lens so as to exhibit a different corresponding effective focal length at a given wavelength or so as to exhibit the same effective focal length at a different corresponding output wavelength.

11. The light-emitting device of claim 1, (i) each primary optical element including a metastructured beam-steering or beam-shaping element, each being characterized by a corresponding steering angle or angular radiative distribution, (ii) metastructures of the beam-steering or beam-shaping elements including one or more of: multitudes of suitably sized and shaped projections, holes, depressions, inclusions, or structures; arrays of nano-antennae; partial photonic bandgap structures; photonic crystals; or arrays of meta-atoms or meta-molecules, (iii) the metastructures of each metastructured beam-steering or beam-shaping element being arranged relative to a corresponding output wavelength so as to collectively impart on corresponding pixel output light a transverse-position-dependent phase delay that results in the corresponding steering angle or angular radiative distribution, and (iv) at least one metastructured beam-steering or beam-shaping element having a structural arrangement of corresponding metastructures thereof different from that of at least one other metastructured beam-steering or beam-shaping element so as to exhibit a different corresponding steering angle or angular radiative distribution at a given wavelength or so as to exhibit the same steering angle or angular radiative distribution at a different corresponding output wavelength.

12. The light-emitting device of claim 1, (i) one or more or all subsets forming corresponding contiguous subarrays of pixel elements within the light-emitting array, or (ii) the pixel elements of one or more or all subsets being interspersed across the light-emitting array among pixel elements of other subsets.

13. The light-emitting device of claim 1 wherein, for one or more subsets, all primary optical elements corresponding to the pixel elements of that subset are arranged to exhibit the same corresponding effective focal length, steering angle, or angular radiative distribution.

14. The light-emitting device of claim 1 wherein, for each subset, primary optical elements corresponding to the pixel elements of that subset are arranged to exhibit the same corresponding effective focal length, steering angle, or angular radiative distribution, each subset differing from at least one other pixel subset with respect to the corresponding effective focal length, steering angle, or angular radiation distribution.

15. The light-emitting device of claim 1, the different far-field illumination patterns differing from one another with respect to one or more of collimation, propagation directions, or angular radiation distributions.

16. The light-emitting device of claim 1, further comprising a drive circuit connected to the light-emitting array and arranged so as to enable independent operation or selective operation of the subsets.

17. The light-emitting device of claim 16, further comprising one or more sensors coupled to the drive circuit, the drive circuit being structured and programmed so as to selectively activate one or more subsets of pixel elements in response to signals from the one or more sensors so as to produce a selected far-field illumination pattern having one or more localized minima or maxima.

18. The light-emitting device of claim 17, the sensor providing a signal to the drive circuit indicative of a sensed object located within the far-field illumination pattern, the drive circuit causing the far-field illumination pattern to exhibit either a localized minimum or a localized maximum at the location of the sensed object.

19. A method for operating the light-emitting device of claim 16, the method comprising:

selectively activating a first subset of pixel elements, or a first group of one or more subsets of pixel elements, so as to produce a first far-field illumination pattern; and selectively activating a second subset of pixel elements, different from the first subset, or a second group of subsets of pixel elements, different from the first group, so as to produce a second far-field illumination pattern different from the first far-field illumination pattern.

20. A light-emitting device comprising:

a light-emitting array having a plurality of light-emitting pixel elements that each emit corresponding pixel output light at a corresponding one of one or more output wavelengths, the light-emitting pixel elements being connected to form multiple distinct subsets with the pixel elements of each subset being operable in unison with one another, the subsets being independently operable; and a primary optics array having a plurality of metastructured primary optical elements that are each arranged so as to receive and redirect pixel output light from at least one corresponding pixel element of the light-emitting array to form a corresponding portion of illumination output light, structural arrangement of corresponding metastructures varying among the primary optical elements of the primary optics array, the illumination output light produced by operation of each subset differs from the illumination output light produced by operation of at least one other subset with respect to wavelength, collimation, propagation direction, or angular radiation distribution, wherein:

(a) all of the pixel elements of the light-emitting array emit pixel output light at a single output wavelength;

(b) all of the pixel elements of each subset emit pixel output light at a single corresponding output wavelength that differs from a corresponding output wavelength of at least one other subset;

(c) the light-emitting device further comprises metastructured angular filters positioned at emission surfaces of corresponding pixel elements of the light-emitting array or between the emission surfaces and the primary optics array, each angular filter being arranged so as to exhibit one or both of (i) incidence-angle-dependent optical transmission of the corresponding pixel output light that decreases with increasing angle of incidence or that has a cutoff angle of incidence above which optical transmission is prevented, or (ii) transmissive redirection of pixel output light exiting the corresponding pixel element to propagate at an angle less than a corresponding incident angle or refracted angle; or (d) (i) each primary optical element includes a metastructured lens, each being characterized by a corresponding effective focal length, (ii) metastructures of the metastructured lenses include one or more of: multitudes of suitably sized and shaped projections, holes, depressions, inclusions, or structures; arrays of nano-antennae; partial photonic bandgap structures; photonic crystals; or arrays of meta-atoms or meta-molecules, (iii) the metastructures of each metastructured lens are arranged relative to a corresponding output wavelength so as to collectively impart on the pixel output light a transverse-position-dependent phase delay that results in the corresponding effective focal length, and (iv) at least one metastructured lens has a structural arrangement of corresponding metastructures thereof different from that of at least one other metastructured lens so as to exhibit a different corresponding effective focal length at a given wavelength or so as to exhibit the same effective focal length at a different corresponding output wavelength.

* * * * *